United States Patent
Park et al.

(10) Patent No.: US 11,658,094 B2
(45) Date of Patent: May 23, 2023

(54) SEMICONDUCTOR PACKAGE

(71) Applicant: Samsung Electronics Co., Ltd., Suwon-si (KR)

(72) Inventors: Soo Jeoung Park, Hwaseong-si (KR); Yun Hyeok Im, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 176 days.

(21) Appl. No.: 17/036,758

(22) Filed: Sep. 29, 2020

(65) Prior Publication Data

US 2021/0257275 A1 Aug. 19, 2021

(30) Foreign Application Priority Data

Feb. 13, 2020 (KR) .................. 10-2020-0017563

(51) Int. Cl.
*H01L 23/48* (2006.01)
*H01L 23/373* (2006.01)
*H01L 23/538* (2006.01)
*H01L 25/18* (2023.01)
*H01L 23/498* (2006.01)

(52) U.S. Cl.
CPC .... *H01L 23/3737* (2013.01); *H01L 23/49822* (2013.01); *H01L 23/5383* (2013.01); *H01L 25/18* (2013.01)

(58) Field of Classification Search
CPC .......... H01L 23/3737; H01L 23/49822; H01L 25/18
See application file for complete search history.

(56) References Cited

U.S. PATENT DOCUMENTS

| | | | |
|---|---|---|---|
| 9,937,662 B2 | 4/2018 | Kuczynski et al. | |
| 10,267,578 B2 | 4/2019 | Wood et al. | |
| 10,355,188 B2 | 7/2019 | Ezaki et al. | |
| 10,388,587 B1 | 8/2019 | Smith et al. | |
| 2011/0038124 A1 | 2/2011 | Burnham et al. | |
| 2011/0161583 A1* | 6/2011 | Youn ........................ | G11C 7/02 711/E12.001 |
| 2012/0305916 A1* | 12/2012 | Liu ........................ | H01L 23/585 257/E23.151 |
| 2017/0346013 A1* | 11/2017 | Chung .................. | C08G 61/122 |
| 2019/0103389 A1* | 4/2019 | Chang .................. | H01L 23/3135 |

FOREIGN PATENT DOCUMENTS

| | | |
|---|---|---|
| JP | 5749314 B2 | 7/2015 |
| JP | 2016135731 A | 7/2016 |
| KR | 101832025 B1 | 2/2018 |
| KR | 101926907 B1 | 12/2018 |

* cited by examiner

*Primary Examiner* — Nicholas J Tobergte
(74) *Attorney, Agent, or Firm* — Harness, Dickey & Pierce, P.L.C.

(57) ABSTRACT

A semiconductor package provided. The semiconductor package includes an interposer layer including a first surface and a second surface opposing each other, a first semiconductor chip and a second semiconductor chip on the first surface of the interposer layer, and a block copolymer film on the first semiconductor chip and the second semiconductor chip. The first semiconductor chip and the second semiconductor chip are different from each other. The block copolymer film includes a first pattern and a second pattern, which are different from each other, and one of the first pattern and the second pattern contains graphite.

18 Claims, 24 Drawing Sheets

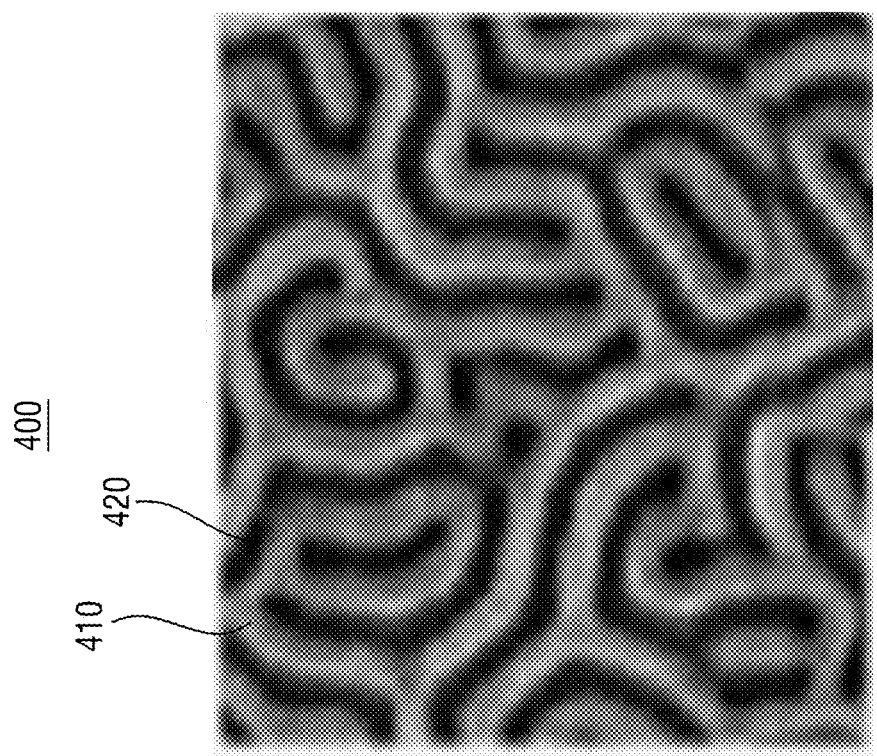

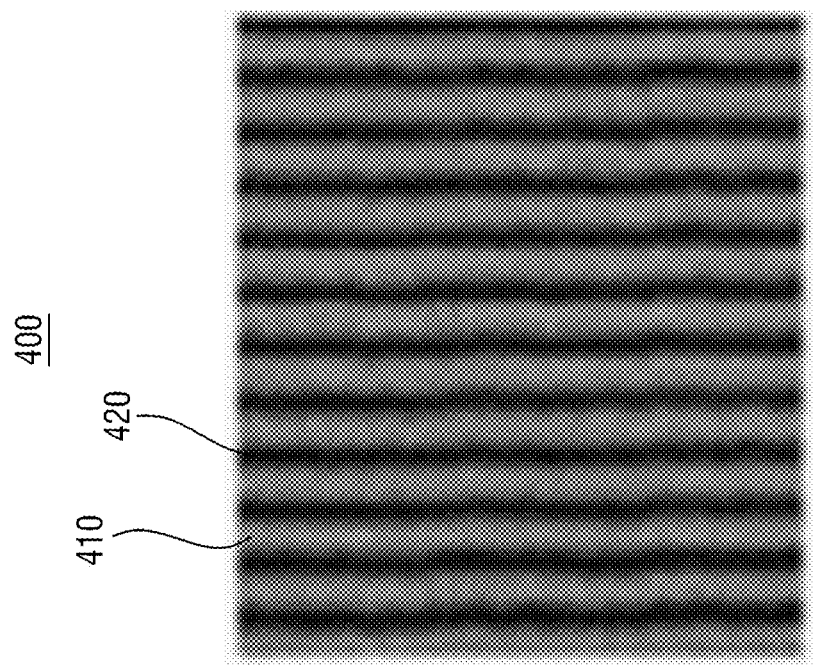

400

US 11,658,094 B2

SEMICONDUCTOR PACKAGE

CROSS-REFERENCE TO RELATED APPLICATION

This application claims priority from Korean Patent Application No. 10-2020-0017563 filed on Feb. 13, 2020 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor package.

2. Description of Related Art

Recently, as high-performance devices are implemented, the size of semiconductor chips may increase, and thus the size of semiconductor packages also may increase. On the other hand, the thickness of the semiconductor packages may decrease as electronic devices become slimmer.

Meanwhile, semiconductor packages have been developed in a direction that satisfies needs for multi-functionality, high capacity, and miniaturization. To this end, several semiconductor chips are integrated into one semiconductor package, thereby achieving high-capacity and multifunctional semiconductor packages while greatly reducing the size of the semiconductor packages.

As the several semiconductor chips are integrated into one semiconductor package, significant heat is generated when the semiconductor package operates, and the heat may cause a problem of deteriorating operation performance of the semiconductor package.

SUMMARY

At least one embodiment relates to a semiconductor package with an improved heat dissipation property and improved product reliability by using a block copolymer film.

However, example embodiments are not restricted to the one set forth herein. The above and other aspects of the example embodiments will become more apparent to one of ordinary skill in the art by referencing the detailed description given below.

According to an example embodiment, a semiconductor package includes an interposer layer including a first surface and a second surface opposing each other, a first semiconductor chip and a second semiconductor chip on the first surface of the interposer layer, where the first semiconductor chip and the second semiconductor chip are different from each other and spaced apart from each other in a first direction, and a block copolymer film on the first semiconductor chip and the second semiconductor chip. The block copolymer film includes a first pattern and a second pattern that are different from each other. One of the first pattern and the second pattern contains graphite.

According to an example embodiment, a semiconductor package includes a substrate including a first surface and a second surface opposing each other, a first semiconductor chip mounted on the first surface of the substrate, a second semiconductor chip on the first semiconductor chip and electrically connected to the first semiconductor chip through a through via penetrating the first semiconductor chip, a molding layer surrounding a top surface of the first semiconductor chip and a side surface of the second semiconductor chip, and a block copolymer film on a top surface of the molding layer and a top surface of the second semiconductor chip. The block copolymer film includes a first pattern and a second pattern that are different from each other. One of the first pattern and the second pattern contains graphite.

According to an example embodiment, a semiconductor package includes a package substrate including a ground electrode therein, an interposer layer connected to the package substrate through one or more first connection terminals, a semiconductor chip connected to the interposer layer through one or more second connection terminals, and a block copolymer film including a first pattern containing graphite and a second pattern not containing graphite. The interposer layer includes a passivation layer including a connection pad electrically connected to the first connection terminals and a redistribution layer on the passivation layer. The redistribution layer includes a plurality of redistribution patterns electrically connected to the connection pad. The second connection terminals are electrically connected to the redistribution layer. The block copolymer film extends along an outer side surface of the semiconductor chip and a side surface of the interposer layer. The block copolymer film is connected to the ground electrode.

BRIEF DESCRIPTION OF THE DRAWINGS

The above and other aspects and features of the present disclosure will become more apparent by describing in detail example embodiments thereof with reference to the attached drawings, in which:

FIGS. 3A to 3D are views illustrating the block copolymer film of FIG. 1;

DETAILED DESCRIPTION

Figure 1:
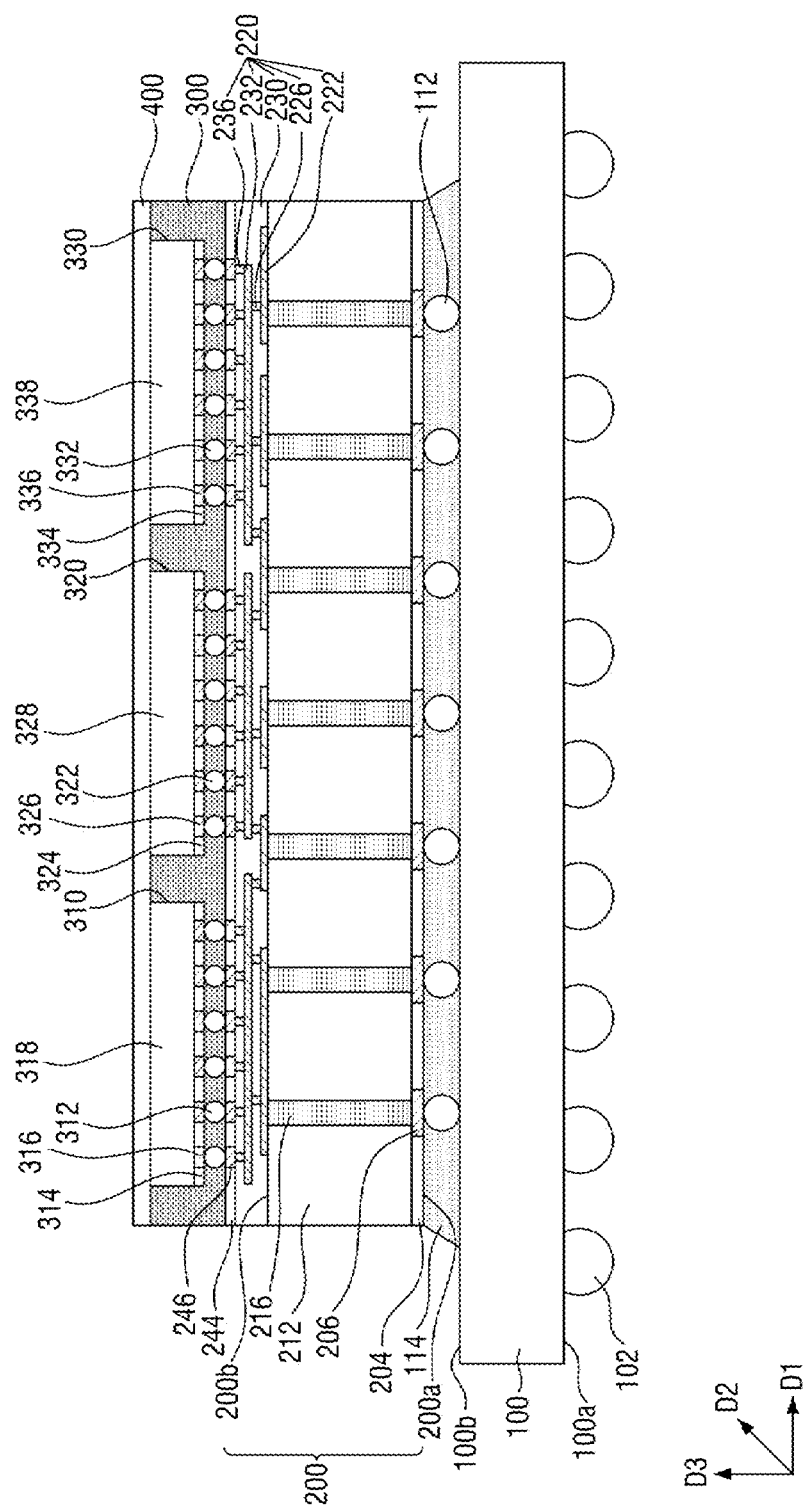
FIG. 1 is a view illustrating a semiconductor package according to some embodiments of the present disclosure.

FIG. 1 is a view illustrating a semiconductor package according to some embodiments of the present disclosure.

Referring to FIG. 1, a semiconductor package according to some embodiments of the present disclosure may include a substrate 100, external connection terminals 102, internal connection terminals 112, an underfill material 114, an interposer layer 200, a molding layer 300, first to third semiconductor chips 318, 328 and 338 and a block copolymer film 400.

The substrate 100 may include a first surface 100a and a second surface 100b opposing each other. The first surface 100a may be a bottom surface of the substrate 100 and the second surface 100b may be a top surface of the substrate 100, in a third direction D3.

The substrate 100 may be a package substrate, for example, a printed circuit board (PCB), a ceramic substrate or the like. When the substrate 100 is the printed circuit board, the substrate 100 may be formed of at least one material selected from phenol resin, epoxy resin and polyimide. For example, the substrate 100 may include at least one material selected from the group consisting of Flame Retardant 4 (FR4), tetrafunctional epoxy, polyphenylene ether, epoxy/polyphenylene oxide, bismaleimide triazine (BT), THERMOUNT® (a non-woven aramid fabric produced by Dupont), cyanate ester, polyimide and a liquid crystal polymer. The surface of the substrate 100 may be covered by a solder resist, but the present inventive concept is not limited thereto.

The external connection terminals 102 may be disposed on the first surface 100a of the substrate 100. The external connection terminals 102 may convexly protrude from the first surface 100a of the substrate 100. The external connection terminals 102 may electrically connect the semiconductor package with an external device. The external connection terminals 102 may be formed in, for example, a ball grid array (BGA).

The internal connection terminals 112 may be disposed on the second surface 100b of the substrate 100. The internal connection terminals 112 may be disposed between the substrate 100 and the interposer layer 200. The internal connection terminals 112 may convexly protrude from the second surface 100b of the substrate 100. In the drawing, the internal connection terminals 112 are illustrated to have ball shapes, but the present disclosure is not limited thereto. Further, the size or shape of the internal connection terminal 112 may be substantially the same as that of the external connection terminal 102, or may be different from that of the external connection terminal 102 as illustrated in the drawing. For example, the internal connection terminal 112 may have a smaller size than the external connection terminal 102.

The external and internal connection terminals 102 and 112 may include at least one of, for example, tin (Sn), indium (In), lead (Pb), zinc (Zn), nickel (Ni), gold (Au), silver (Ag), copper (Cu), antimony (Sb), bismuth (Bi), or a combination thereof, but the present inventive concept is not limited thereto.

The underfill material 114 may be disposed between the substrate 100 and the interposer layer 200. That is, the underfill material 114 may be disposed between the second surface 100b of the substrate 100 and a first surface 200a of the interposer layer 200. The underfill material 114 may be formed to enclose the internal connection terminals 112. Accordingly, the underfill material 114 may protect the internal connection terminals 112.

The underfill material 114 may include, e.g., epoxy resin, benzocyclobutyne or polyimide. However, the embodiments of the present disclosure are not limited thereto. For example, the underfill material 114 may further include a silica filler. As another example, the underfill material 114 may include an adhesive and a flux. The flux may include an oxide film remover. As still another example, the underfill material 114 may include a silica filler or flux. As yet another example, the underfill material 114 can include non-conductive paste.

The interposer layer 200 may include the first surface 200a and a second surface 200b opposing each other. The first surface 200a may be a bottom surface of the interposer layer 200 and the second surface 200b may be a top surface of the interposer layer 200, in the third direction D3

The interposer layer 200 may include a first passivation layer 204, a substrate layer 212, a redistribution layer 220, and a second passivation layer 244.

The first passivation layer 204 may include connection pads 206. The first passivation layer 204 may at least partially expose the connection pads 206. The connection pads 206 may include a conductive material to be electrically connected to one or more internal connection terminals 112. Accordingly, the interposer layer 200 may be bonded to and electrically connected to the substrate 100 through the internal connection terminals 112. The first passivation layer 204 may include, for example, an oxide film or a nitride film, but the present disclosure is not limited thereto.

The substrate layer 212 may be disposed on the first passivation layer 204. The substrate layer 212 may include, for example, silicon (Si). The substrate layer 212 may include first through vias 216. The first through vias 216 may be disposed in the substrate layer 212 to penetrate the substrate layer 212. The first through via 216 may have a different extension shape depending on whether the first through via 216 is formed before a front end of line (FEOL), formed between the FEOL and a back end of line (BEOL), formed during the BEOL, or formed after the BEOL.

The redistribution layer 220 may be disposed on the substrate layer 212. The redistribution layer 220 may include a plurality of redistribution patterns 222 and 232 and a plurality of vias 226 and 236 and an insulating layer 230.

The redistribution layer 220 may include the first redistribution patterns 222, the first vias 226, the second redistribution patterns 232 and the second vias 236, which are sequentially disposed from bottom to top. Although the insulating layer 230 is illustrated as a single layer in the drawing, the present disclosure is not limited thereto, and the insulating layer 230 may have a plurality of layers. In addition, the numbers, locations, or arrangements of the redistribution patterns 222 and 232, and the vias 226 and 236 may vary.

The first and second redistribution patterns 222 and 232, the first and second vias 226 and 236 may include a conductive material. Therefore, an electrical path may be formed in the redistribution layer 220. The first and second redistribution patterns 222 and 232, the first and second vias 226 and 236 may include, for example, at least one of copper (Cu), aluminum (Al), silver (Ag), tin (Sn), gold (Au), nickel (Ni), lead (Pb), titanium (Ti), or an alloy thereof, but the present disclosure is not limited thereto.

The first and second redistribution patterns 222 and 232 may perform various functions according to the corresponding pattern design. For example, the first and second redistribution patterns 222 and 232 may include a ground pattern, a power pattern, a signal pattern, and the like. The signal pattern may input/output various electrical signals such as data electrical signals or the like, except for a ground signal and a power signal.

The first and second vias 226 and 236 may pass through the insulating layer 230 to connect the first redistribution pattern 222 and the second redistribution pattern 232 to each other. In one example, the width of the first via 226 and the second via 236 may increase or decrease from the first surface 200a of the interposer layer 200 toward the second surface 200b of the interposer layer 200.

The second passivation layer 244 may be disposed on the redistribution layer 220. The second passivation layer 244 may include redistribution pads 246. The second passivation layer 244 may at least partially expose the redistribution pads 246. The redistribution pads 246 may include a conductive material to be electrically connected to the redistribution layer 220. The second passivation layer 244 may include, for example, an oxide film or a nitride film, but the present disclosure is not limited thereto.

The semiconductor chips 318, 328, and 338 may be disposed over the second surface 200b of the interposer layer 200. The semiconductor chips 318, 328, and 338 may be spaced apart from each other in a first direction D1. That is, the first semiconductor chip 318, the second semiconductor chip 328 and the third semiconductor chip 338 may be disposed over the second surface 200b of the interposer layer 200 while being spaced apart from each other in the first direction D1. Although three semiconductor chips 318, 328, and 338 are illustrated in the drawing, the number of semiconductor chips 318, 328, and 338 may vary without being limited thereto. The semiconductor chips 318, 328, and 338 may be electrically connected to the substrate 100 through the interposer layer 200.

The second semiconductor chip 328 may be, for example, a logic chip such as a central processor unit (CPU), a micro processor unit (MPU), a graphics processor unit (GPU), a controller, or an application specific integrated circuit (ASIC), a modem chip, or the like. Further, the first and third semiconductor chips 318 and 338 may be application processors (APs) used in mobile phones or smart phones.

The first and third semiconductor chips 318 and 338 may be different types of memory chips from the second semiconductor chip 328. The first and third semiconductor chips 318 and 338 may be, for example, memory chips. For example, the memory chips may be volatile memory chips such as a dynamic random access memory (DRAM) or a static random access memory (SRAM), or may be non-volatile memory chips such as a phase-change random access memory (PRAM), a magnetoresistive random access memory (MRAM), a ferroelectric random access memory (FeRAM) or a resistive random access memory (RRAM). The memory chip may be also a high bandwidth memory (HBM) chip in which a plurality of DRAM chips are stacked. The first and third semiconductor chips 318 and 338 may be the same type of memory chip, or different types of memory chips. For example, the first and third semiconductor chips 318 and 338 may be the HBM chips.

First connection terminals 312 may be disposed under a bottom surface of the first semiconductor chip 318. Second connection terminals 322 may be disposed under a bottom surface of the second semiconductor chip 328. Third connection terminals 332 may be disposed under a bottom surface of the third semiconductor chip 338. The first to third connection terminals 312, 322, and 332 may be disposed on the redistribution pads 246 to contact the redistribution pads 246.

The first to third connection terminals 312, 322, and 332 may substantially have the same size or shape as shown in the drawing, or may have different sizes or shapes. Further, the first to third connection terminals 312, 322, and 332 may have a smaller size than that of the external connection terminals 102. Furthermore, the first to third connection terminals 312, 322, and 332 may have a smaller size than that of the internal connection terminals 112. The first to third connection terminals 312, 322, and 332 may be, for example, at least one of tin (Sn), indium (In), lead (Pb), zinc (Zn), nickel (Ni), gold (Au), silver (Ag), copper (Cu), antimony (Sb), bismuth (Bi), or a combination thereof, but the present inventive concept is not limited thereto.

A third-first passivation layer 314 may be disposed on a bottom surface of the first semiconductor chip 318. The third-first passivation layer 314 may include first chip pads 316. The first chip pads 316 may be electrically connected to the first connection terminals 312. A third-second passivation layer 324 may be disposed on a bottom surface of the second semiconductor chip 328. The third-second passivation layer 324 may include second chip pads 326. The second chip pads 326 may be electrically connected to the second connection terminals 322. A third-third passivation layer 334 may be disposed on a bottom surface of the third semiconductor chip 338. The third-third passivation layer 334 may include third chip pads 336. The third chip pads 336 may be electrically connected to the third connection terminals 332. Accordingly, the first to third semiconductor chips 318, 328, and 338 may be electrically connected to the redistribution layer 220 through the first to third connection terminals 312, 322, and 332, respectively.

The first to third chip pads 316, 326, and 336 may include a conductive material. The third-first, third-second, and third-third passivation layers 314, 324, and 334 may include, for example, an oxide film or a nitride film, but the present disclosure is not limited thereto.

The molding layer 300 may be disposed over the second surface 200b of the interposer layer 200. The molding layer 300 may include first to third trenches 310, 320 and 330. The first to third semiconductor chips 318, 328, and 338 may be respectively disposed in the first to third trenches 310, 320, and 330. That is, the molding layer 300 may cover each of the first to third semiconductor chips 318, 328, and 338, partially or entirely. The molding layer 300 may fill gaps between the interposer layer 200 and the first to third semiconductor chips 318, 328, and 338. The molding layer 300 may fill gaps between the adjacent first connection terminals 312, between the adjacent second connection terminals 322, and between the adjacent third connection terminals 332.

The drawing illustrates that the molding layer 300 covers side surfaces of the first to third semiconductor chips 318, 328, and 338, and exposes top surfaces thereof, but this is merely an example. As another example, the molding layer 300 may cover all of the side surfaces and the top surfaces of the first to third semiconductor chips 318, 328, and 338. The molding layer 300 may include an insulating material.

For example, the molding layer 300 may include a thermosetting resin such as an epoxy resin, a thermoplastic resin such as polyimide, or composite resins of the above-described resins and an inorganic filler or a resin impregnated with a core material such as glass fiber (or glass cloth, glass fabric) and the inorganic filler (e.g., prepreg, Ajinomoto build-up film (ABF), FR-4 and bismaleimide triazine (BT)). Alternatively, the molding layer 300 may include a photo imageable dielectric (PID).

The block copolymer film 400 may be disposed on the first to third semiconductor chips 318, 328, and 338, and the molding layer 300. The block copolymer film 400 may extend along a top surface of the molding layer 300 and the top surfaces of the first to third semiconductor chips 318, 328, and 338. The block copolymer film 400 may contact the top surfaces of the first to third semiconductor chips 318, 328, and 338. The block copolymer film 400 may entirely cover the top surfaces of the molding layer 300 and the first to third semiconductor chips 318, 328, and 338. A thickness of the block copolymer film 400 may vary according to needs or processes. In the following, the block copolymer film 400 will be described in detail with reference to FIGS. 2A and 2B.

Figure 2A:
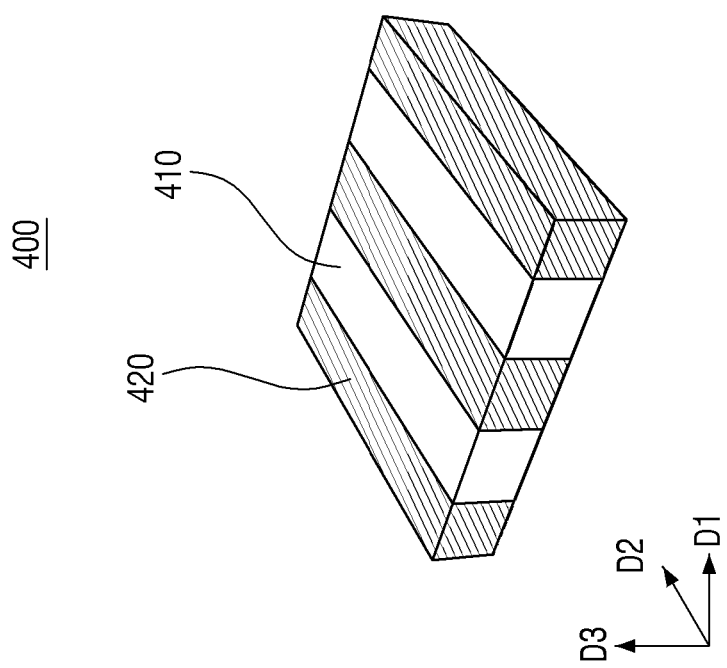
FIGS. 2A and 2B are views illustrating a block copolymer film of FIG. 1.
Figure 2B:
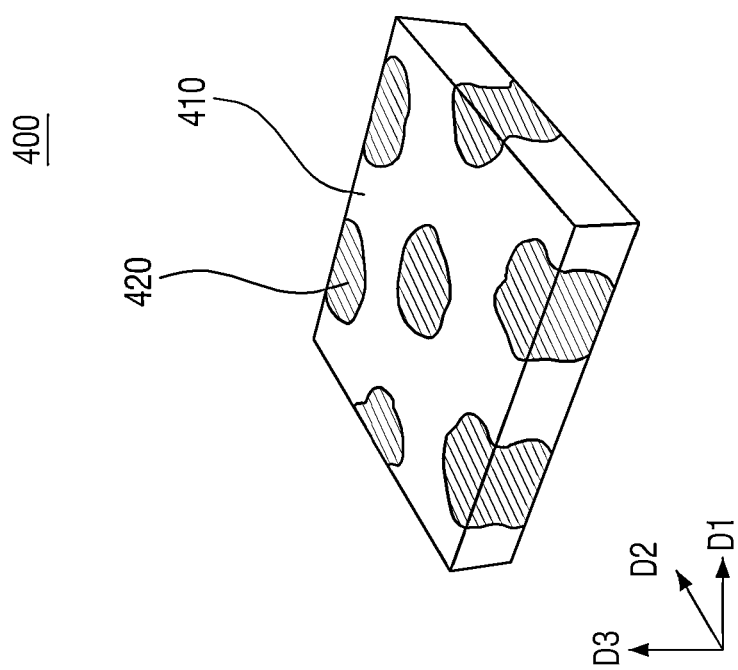
Figure 3C:
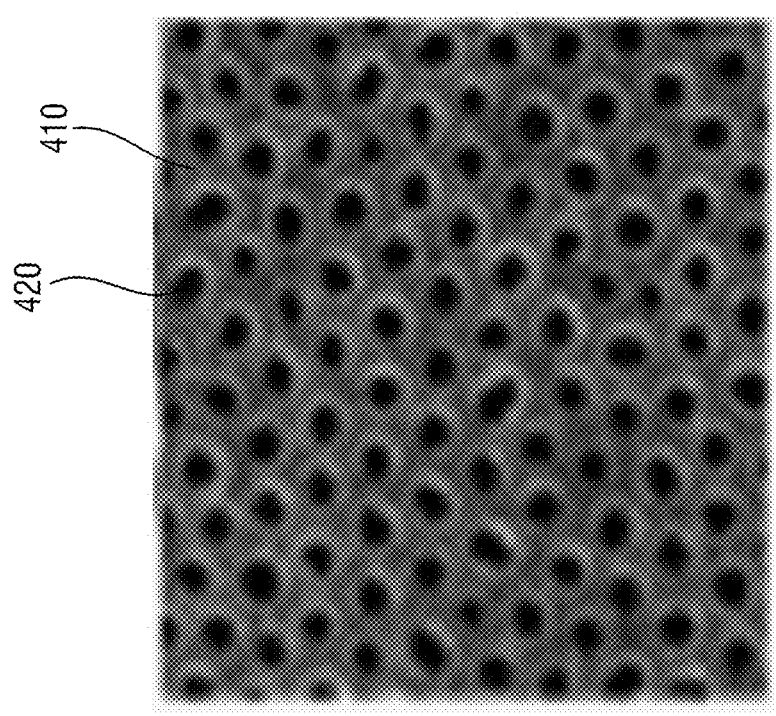
Figure 3D:
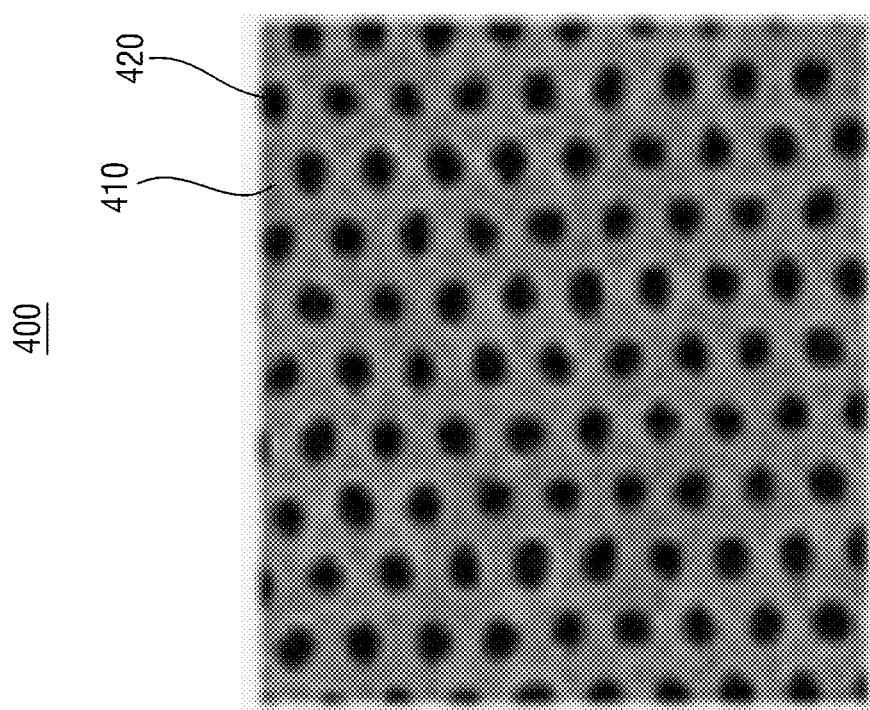

FIGS. 2A and 2B are views illustrating the block copolymer film of FIG. 1. FIGS. 2A and 2B mainly show the top surface of the block copolymer film of FIG. 1, while omitting other components of FIG. 1.

A block copolymer of the block copolymer film 400 may include, for example, a first polymer block and a second polymer block combined in a block form. One of the first polymer block and the second polymer block may exhibit hydrophilicity, and the other may exhibit hydrophobicity. The hydrophilic polymer block may have polarity.

For example, the block copolymer may include at least one material selected from the group consisting of polystyrene-block-polymethylmethacrylate (PS-b-PMMA), polybutadiene-block-polybutylmethacrylate, polybutadiene-block-polydimethylsiloxane, polybutadiene-block-polymethylmethacrylate, polybutadiene-block-polyvinylpyridine, polybutylacrylate-block-polymethylmethacrylate, polybutylacrylate-block-polyvinylpyridine, polyisoprene-block-polyvinylpyridine, polyisoprene-block-polymethylmethacrylate, polyhexylacrylate-block-polyvinylpyridine, polyisobutylene-block-polybutylmethacrylate, polyisobutylene-block-polymethylmethacrylate, polyisobutylene-block-polybutylmethacrylate, polyisobtylene-block-polydimethylsiloxane, polybutylmethacrylate-block-polybutylacrylate, polyethylethylene-block-polymethylmethacrylate, polystyrene-block-polybutylmethacrylate, polystyrene-block-polybutadiene, polystyrene-block-polyisoprene, polystyrene-block-polydimethylsiloxane, polystyrene-block-polyvinylpyridine, polyethylethylene-block-polyvinylpyridine, polyethylene-block-polyvinylpyridine, polyvinylpyridine-block-polymethylmethacrylate, polyethyleneoxide-block-polyisoprene, polyethyleneoxide-block-polybutadiene, polyethyleneoxide-block-polystyrene, polyethyleneoxide-block-polymethylmethacrylate, polyethyleneoxide-block-polydimethylsiloxane, polystyrene-block-polyethyleneoxide, polystyrene-block-polymethylmethacrylate-block-polystyrene, polybutadiene-block-polybutylmethacrylate-block-polybutadiene, polybutadiene-block-polydimethylsiloxane-block-polybutadiene, polybutadiene-block-polymethylmethacrylate-block-polybutadiene, polybutadiene-block-polyvinylpyridine-block-polybutadiene, polybutylacrylate-block-polymethylmethacrylate-block-polybutylacrylate, polybutylacrylate-block-polyvinylpyridine-block-polybutylacrylate, polyisoprene-block-polyvinylpyridine-block-polyisoprene, polyisoprene-block-polymethylmethacrylate-block-polyisoprene, polyhexylacrylate-block-polyvinylpyridine-block-polyhexylacrylate, polyisobutylene-block-polybutylmethacrylate-block-polyisobutylene, polyisobutylene-block-polymethylmethacrylate-block-polyisobutylene, polyisobutylene-block-polybutylmethacrylate-block-polyisobutylene, polyisobutylene-block-polydimethylsiloxane-block-polyisobutylene, polybutylmethacrylate-block-polybutylacrylate-block-polybutylmethacrylate, polyethylethylene-block-polymethylmethacrylate-block-polyethylethylene, polystyrene-block-polybutylmethacrylate-block-polystyrene, polystyrene-block-polybutadiene-block-polystyrene, polystyrene-block-polyisoprene-block-polystyrene, polystyrene-block-polydimethylsiloxane-block-polystyrene, polystyrene-block-polyvinylpyridine-block-polystyrene, polyethylethylene-block-polyvinylpyridine-block-polyethylethylene, polyethylene-block-polyvinylpyridine-block-polyethylene, polyvinylpyridine-block-polymethylmethacrylate-block-polyvinylpyridine, polyethyleneoxide-block-polyisoprene-block-polyethyleneoxide, polyethyleneoxide-block-polybutadiene-block-polyethyleneoxide, polyethyleneoxide-block-polystyrene-block-polyethyleneoxide, polyethyleneoxide-block-polymethylmethacrylate-block-polyethyleneoxide, polyethyleneoxide-block-polydimethylsiloxane-block-polyethyleneoxide, and polystyrene-block-polyethyleneoxide-block-polystyrene. The block copolymer may be formed by a method of dissolving the selected material in a solvent and then performing spin coating, or the like. The solvent may be, for example, toluene. After the coating, most of the solvent may be evaporated.

FIGS. 3A to 3D are views illustrating the block copolymer film of FIG. 1.

Referring to FIGS. 3A to 3D, the block copolymer film 400 according to some embodiments of present disclosure may include a first pattern 410 and a second pattern 420. One of the first pattern 410 and the second pattern 420 may contain graphite. In the block copolymer film 400, microphase separation may occur by an annealing process, and thus the block copolymer film 400 may be separated into the first pattern 410 and the second pattern 420. The annealing process may include, for example, irradiating ultraviolet (UV) light or applying heat to the block copolymer film 400.

The block copolymer film 400 may include, for example, the first polymer block, the second polymer block, and graphite. In the block copolymer film 400, the microphase separation may occur by the annealing process. At this time, graphite may be aligned by one of the first polymer block and the second polymer block.

As another example, the block copolymer film 400 may include the first polymer block and graphite. Between the first polymer block and the second polymer block, the second polymer block is removed by the microphase separation, and graphite is inserted instead of the removed second polymer block, thereby forming the block copolymer film 400. Accordingly, graphite may be arranged in the position where the second polymer has been present.

Referring to FIG. 2A, the second patterns 420 may have a cylindrical shape, and the first pattern 410 may fill a space between the second patterns 420.

The first pattern 410 and the second pattern 420 may include different polymer blocks, one of which may contain graphite. Alternatively, one of the first pattern 410 and the second pattern 420 may include a polymer block, and the other may include graphite. For example, the first pattern 410 may include the polymer block, and the second pattern 420 may include graphite having higher thermal conductivity than copper or silver.

Meanwhile, in a conventional semiconductor package, heat generated from a semiconductor package is released to the outside through a thermal interface material (TIM) layer and a heat slug. When the heat is released, heat dissipation efficiency is decreased somewhat as the heat passes through the TIM layer. Since, however, the semiconductor package according to some embodiments of the present disclosure includes the block copolymer film 400 containing graphite with high thermal conductivity, heat generated in the semiconductor package can be easily released to the outside. Therefore, the heat dissipation efficiency of the semiconductor package can be improved. In addition, the heat slug may be omitted by using the block copolymer film 400 containing graphite, so that a thickness of the semiconductor package can be decreased.

FIG. 2B illustrates the block copolymer film 400 according to a different embodiment from the block copolymer film 400 shown in FIG. 2A. The following description will focus on differences from the embodiment of FIG. 2A. Referring to FIG. 2B, the first patterns 410 and the second patterns 420 may extend in a second direction D2. The first patterns 410 may be arranged to be spaced apart from each other in the first direction D1, and the second patterns 420 may be also arranged to be spaced apart from each other in the first direction D1. That is, the second pattern 420 may be disposed between the adjacent first patterns 410, or vice versa.

Referring to FIGS. 1 and 2B, the first pattern 410 may be disposed on the second semiconductor chip 328, and the second patterns 420 may be disposed on the first and third semiconductor chips 318 and 338. For example, the first and third semiconductor chips 318 and 338 may be memory chips, the second semiconductor chip 328 may be a logic chip, and the second pattern 420 may contain graphite. Logic chips may generate more heat than memory chips. Therefore, as the second pattern 420 containing graphite is disposed on the logic chip, heat generated from the logic chip can be easily released to the outside through the graphite. That is, it is possible to improve reliability and operation performance of the semiconductor package according to some embodiments of the present disclosure.

FIGS. 3A to 3D are views illustrating the block copolymer film of FIG. 1. FIGS. 3A to 3D are views illustrating the block copolymer film of FIG. 1. FIGS. 3A to 3D show the block copolymer films 400 according to a volume ratio of the first polymer block and the second polymer block included therein.

The first pattern 410 and the second pattern 420 may be formed according to the volume ratio of the first polymer block and the second polymer block. For example, referring to FIG. 3B, the first pattern 410 and the second pattern 420 may be formed in cylindrical shapes according to the volume ratio of the first polymer block and the second polymer block. Further, referring to FIG. 3D, the second pattern 420 may be formed in a cylindrical shape and the first pattern 410 may be shaped to surround the second pattern 420.

Figure 4:
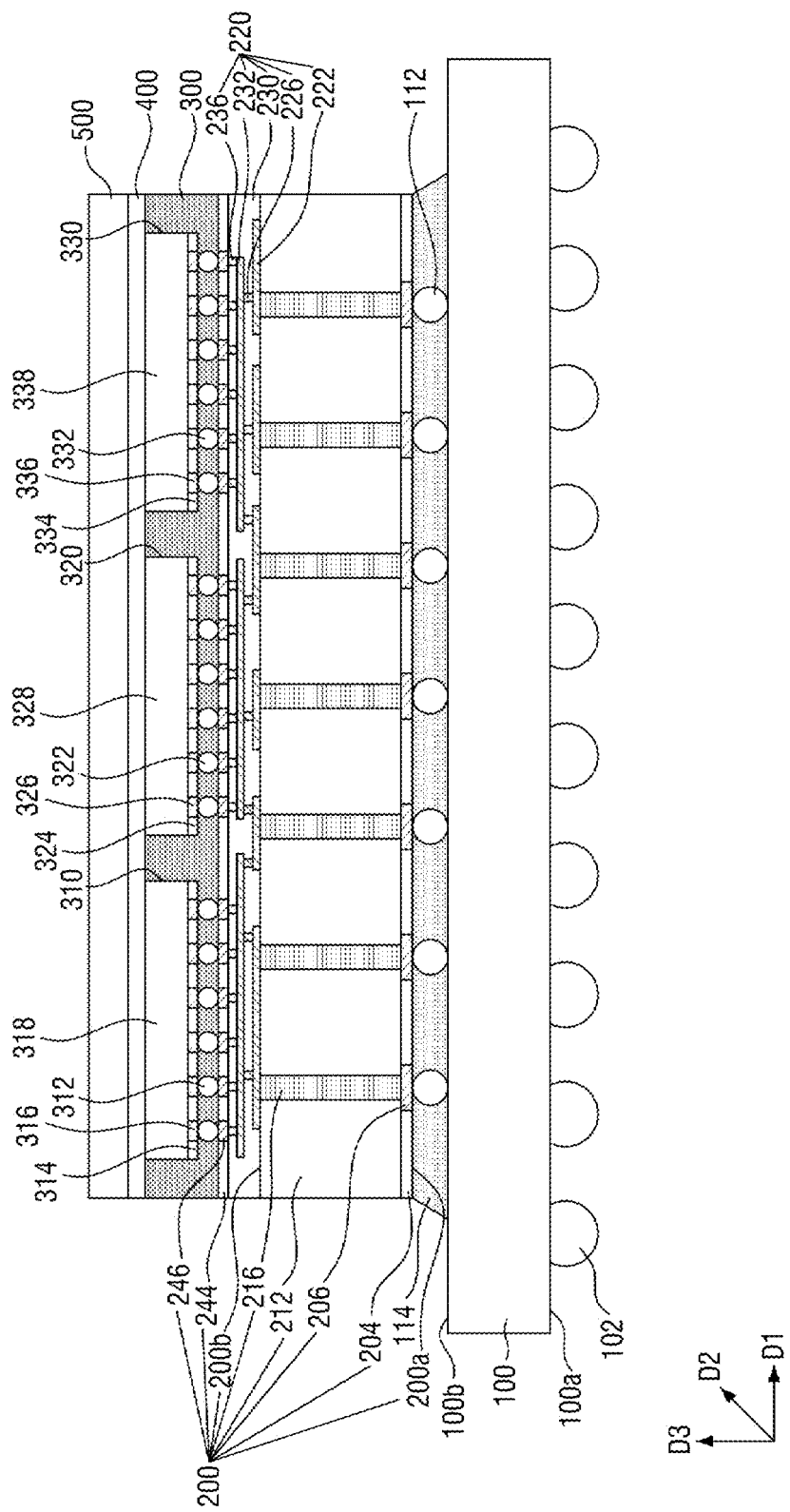
FIG. 4 is a view illustrating a semiconductor package according to some other embodiments of the present disclosure.

FIG. 4 is a view illustrating a semiconductor package according to some other embodiments of the present disclosure. The following description will focus on differences from the embodiment of FIG. 1.

Referring to FIG. 4, a semiconductor package according to some other embodiments of the present disclosure may further include a heat slug 500. The heat slug 500 may be disposed on the block copolymer film 400. The heat slug 500 may extend along the top surface of the block copolymer film 400, while contacting the block copolymer film 400. The block copolymer film 400 may function as an adhesive layer to attach the heat slug 500 to the first to third semiconductor chips 318, 328, and 338 and the molding layer 300.

Therefore, heat generated in the semiconductor package can be easily released to the outside through the block copolymer film 400 and the heat slug 500.

Figure 5:
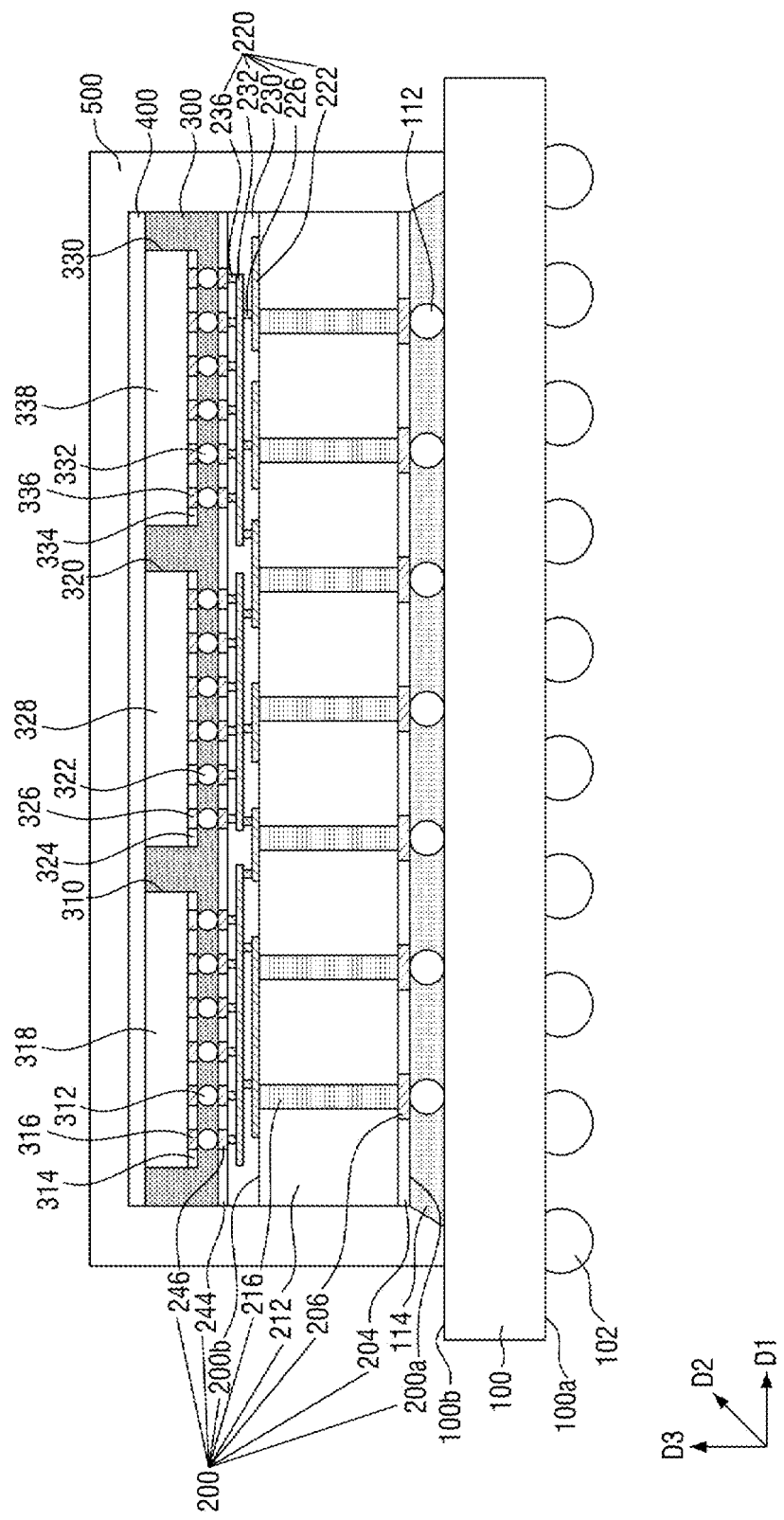
FIG. 5 is a view illustrating a semiconductor package according to some other embodiments of the present disclosure.

FIG. 5 is a view illustrating a semiconductor package according to some other embodiments of the present disclosure. The following description will focus on differences from the embodiment of FIG. 4.

Referring to FIG. 5, the heat slug 500 of the semiconductor package according to some other embodiments of the present disclosure may be disposed on the block copolymer film 400, the interposer layer 200, and the substrate 100. That is, the heat slug 500 may extend along the top surface of the block copolymer film 400, and side surfaces of the molding layer 300 and the interposer layer 200.

Figure 6:
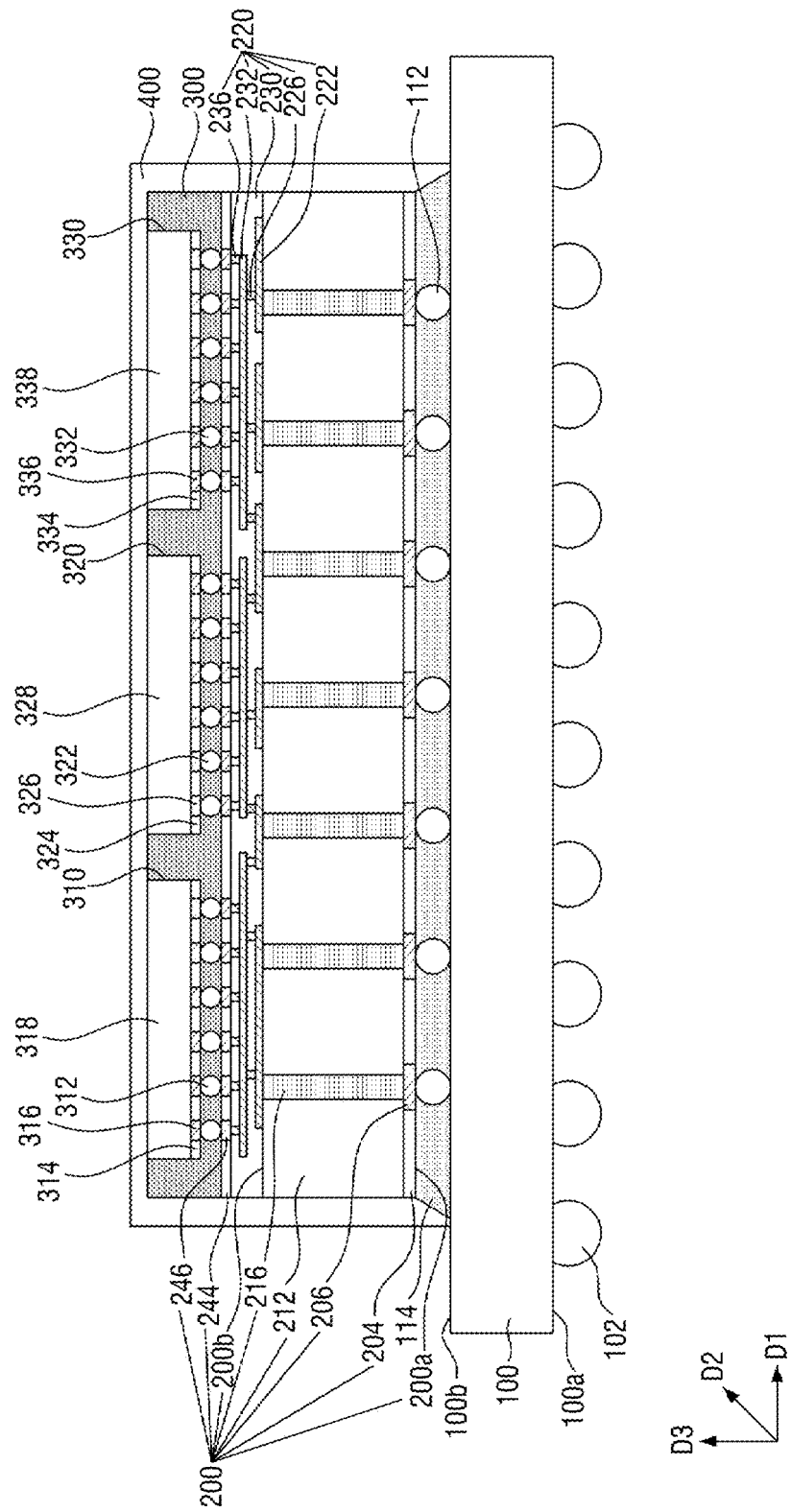
FIG. 6 is a view illustrating a semiconductor package according to some other embodiments of the present disclosure.

FIG. 6 is a view illustrating a semiconductor package according to some other embodiments of the present disclosure. The following description will focus on differences from the embodiment of FIG. 1.

Referring to FIG. 6, the block copolymer film 400 of a semiconductor package according to some other embodiments of present disclosure may be disposed on the first to third semiconductor chips 318, 328, and 338, the molding layer 300 and the interposer layer 200. That is, the block copolymer film 400 may extend along the top surfaces of the first to third semiconductor chips 318, 328, and 338, the top surface and the side surface of the molding layer 300, and the side surface of the interposer layer 200.

Although not shown in the drawing, the block copolymer film 400 may be connected to a ground region included in the substrate 100. The substrate 100 may include the ground region and a ground via connected to the ground region. The block copolymer film 400 may be connected to the ground region through the ground via. For example, graphite of the block copolymer film 400 may be connected to the ground region through the ground via.

Therefore, the block copolymer film 400 may ground and remove electromagnetic waves entering from the outside of the semiconductor package, and thus shield electromagnetic interference. Accordingly, the block copolymer film 400 may limit and/or prevent breakage and malfunction of the semiconductor package, and thus it is possible to ensure operational reliability of the semiconductor package. In addition, the block copolymer film 400 may also block electromagnetic waves emitted from the semiconductor package to the outside, and therefore, it is possible to limit and/or prevent malfunction of an adjacent semiconductor device or semiconductor package.

Figure 7:
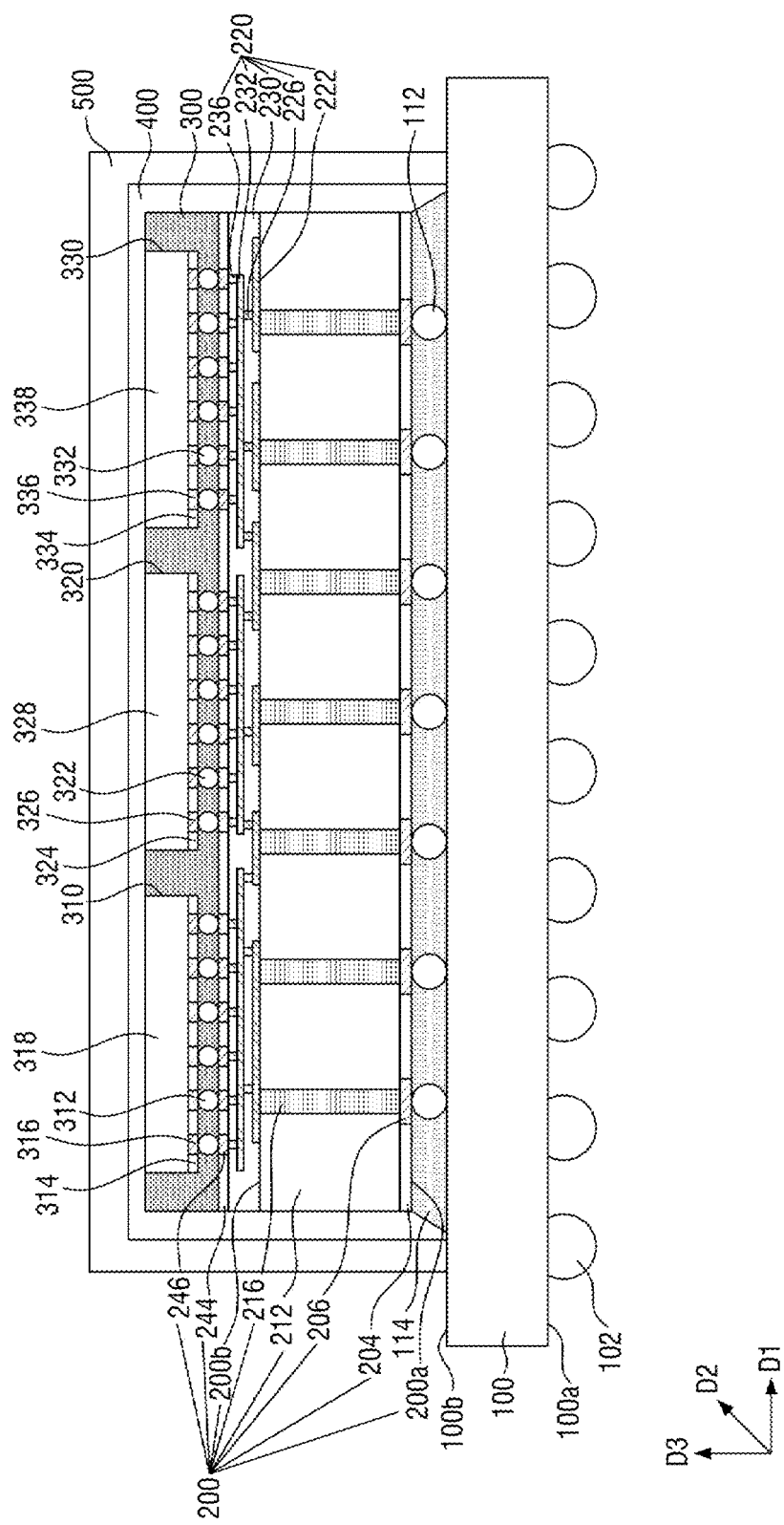
FIG. 7 is a view illustrating a semiconductor package according to some other embodiments of the present disclosure.

FIG. 7 is a view illustrating a semiconductor package according to some other embodiments of the present disclosure. The following description will focus on differences from the embodiment of FIG. 6.

Referring to FIG. 7, a semiconductor package according to some other embodiments of the present disclosure may further include the heat slug 500. The heat slug 500 may be disposed on the block copolymer film 400. The heat slug 500 may extend along the block copolymer film 400.

Figure 8:
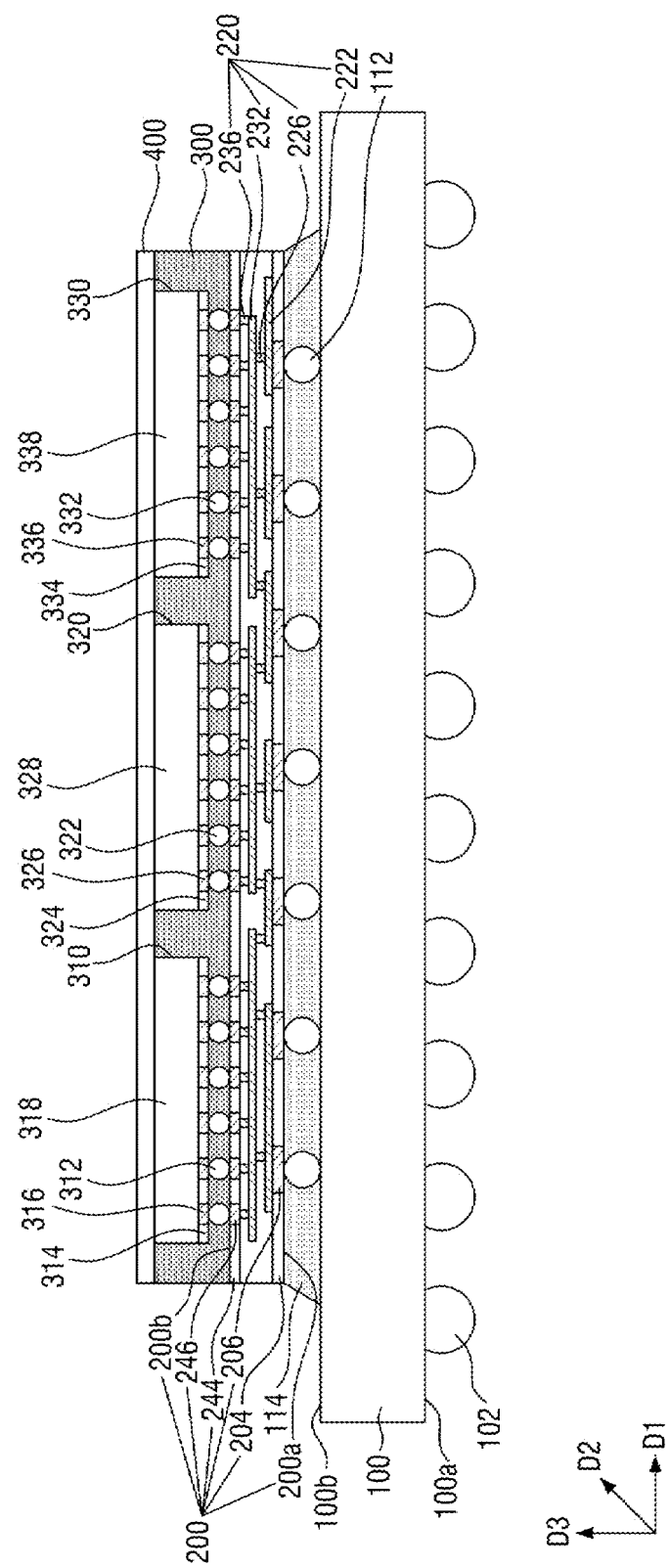
FIG. 8 is a view illustrating a semiconductor package according to some other embodiments of the present disclosure.

FIG. 8 is a view illustrating a semiconductor package according to some other embodiments of the present disclosure. The following description will focus on differences from the embodiment of FIG. 1.

Referring to FIG. 8, a semiconductor package according to some other embodiments of the present disclosure may include the substrate 100, the underfill material 114, the internal connection terminals 112, the interposer layer 200, the molding layer 300, and the first to third semiconductor chips 318, 328, and 338, and the block copolymer film 400. The interposer layer 200 may include the first passivation layer 204, the redistribution layer 220, and the second passivation layer 244. The first to third semiconductor chips 318, 328, and 338 may be connected to the redistribution layer 220 through the first to third chip pads 316, 326, and 336 and the first to third connection terminals 312, 322, and 332, respectively.

The block copolymer film 400 may be disposed on the first to third semiconductor chips 318, 328 and 338, and the molding layer 300.

Figure 9:
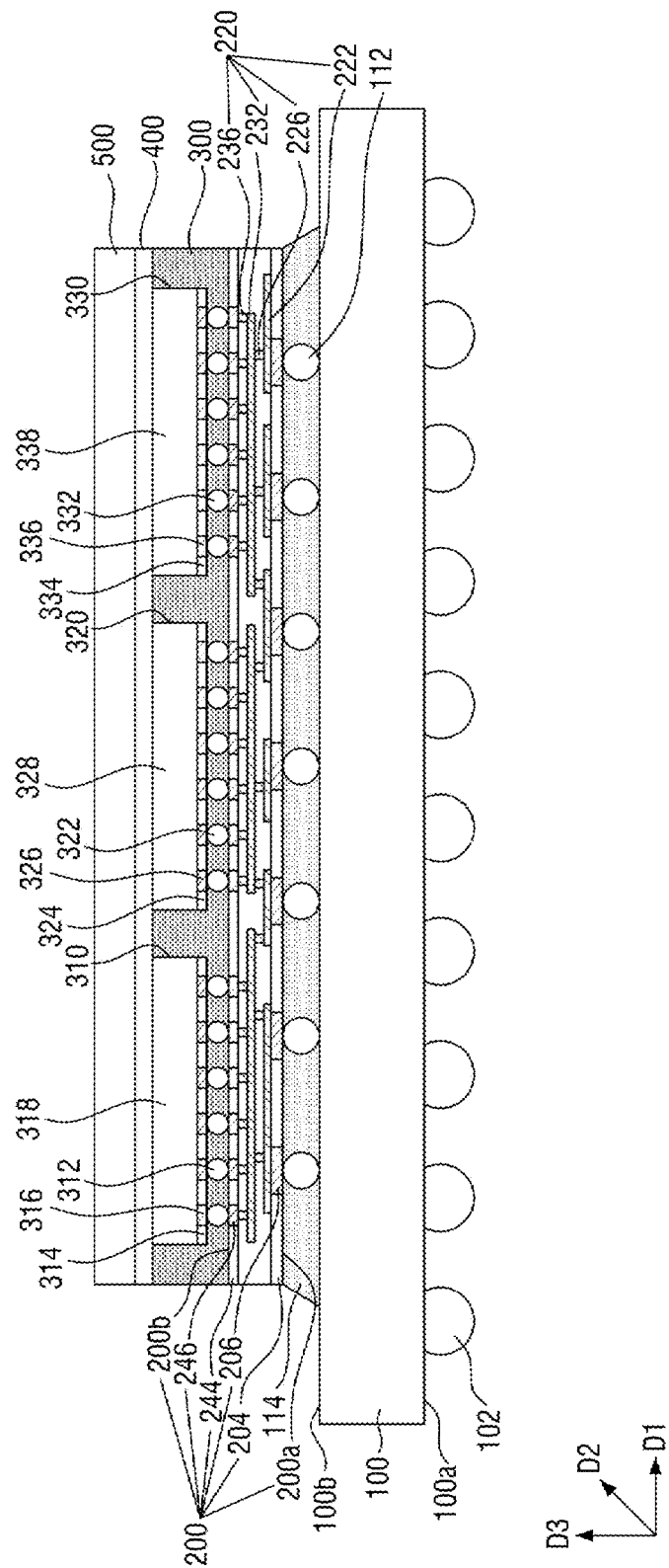
FIG. 9 is a view illustrating a semiconductor package according to some other embodiments of the present disclosure.

FIG. 9 is a view illustrating a semiconductor package according to some other embodiments of the present disclosure. The following description will focus on differences from the embodiment of FIG. 8.

Referring to FIG. 9, a semiconductor package according to some embodiments of present disclosure may further include the heat slug 500. The heat slug 500 may be disposed on the block copolymer film 400.

Figure 10:
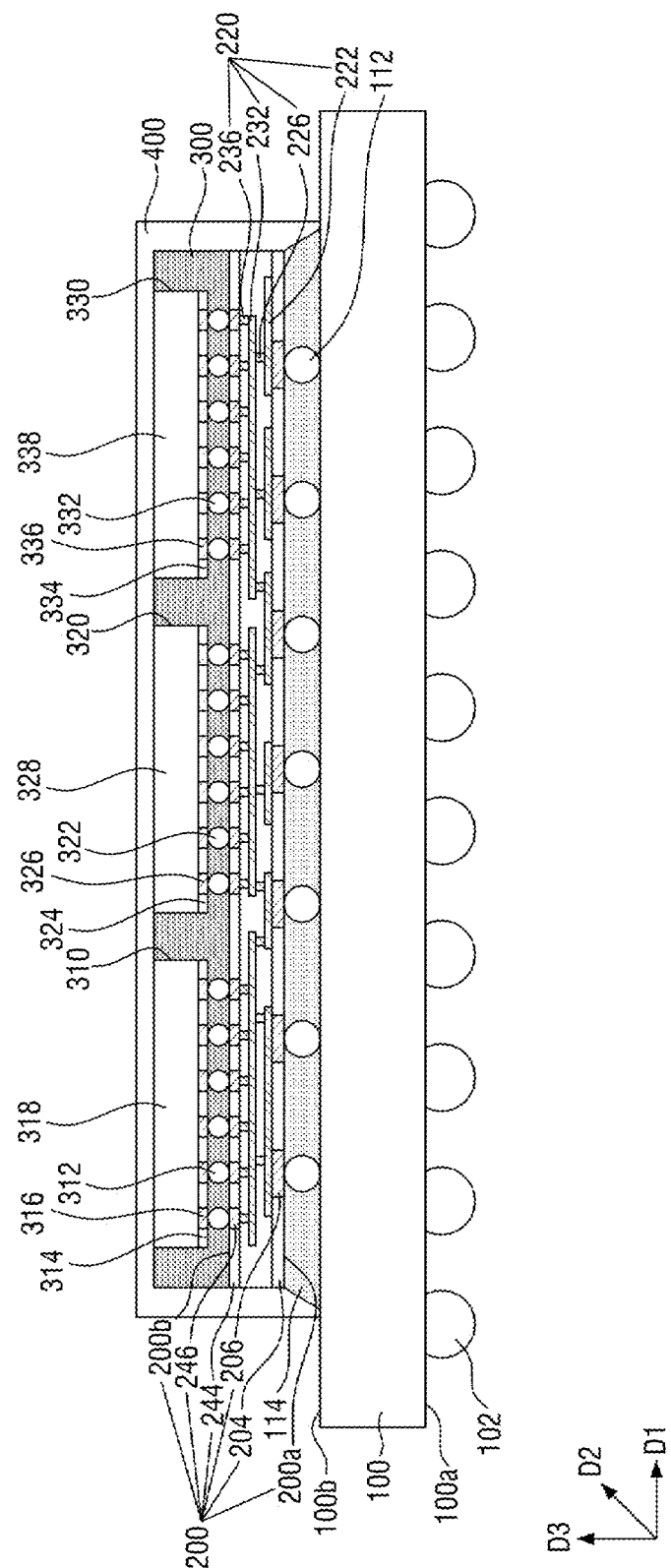
FIG. 10 is a view illustrating a semiconductor package according to some other embodiments of the present disclosure.

FIG. 10 is a view illustrating a semiconductor package according to some other embodiments of the present disclosure. The following description will focus on differences from the embodiment of FIG. 8.

Referring to FIG. 10, the block copolymer film 400 may be disposed on the first to third semiconductor chips 318, 328, and 338, the molding layer 300 and the interposer layer 200. That is, the block copolymer film 400 may extend along the top surfaces of the first to third semiconductor chips 318 328, and 338, the top surface and the side surface of the molding layer 300, and the side surface of the interposer layer 200.

Although not shown in the drawing, the block copolymer film 400 may be connected to the ground region of the substrate 100. The substrate 100 may include the ground region and the ground via connected to the ground region. The block copolymer film 400 may be connected to the ground region through the ground via. For example, graphite of the block copolymer film 400 may be connected to the ground region through the ground via.

Figure 11:
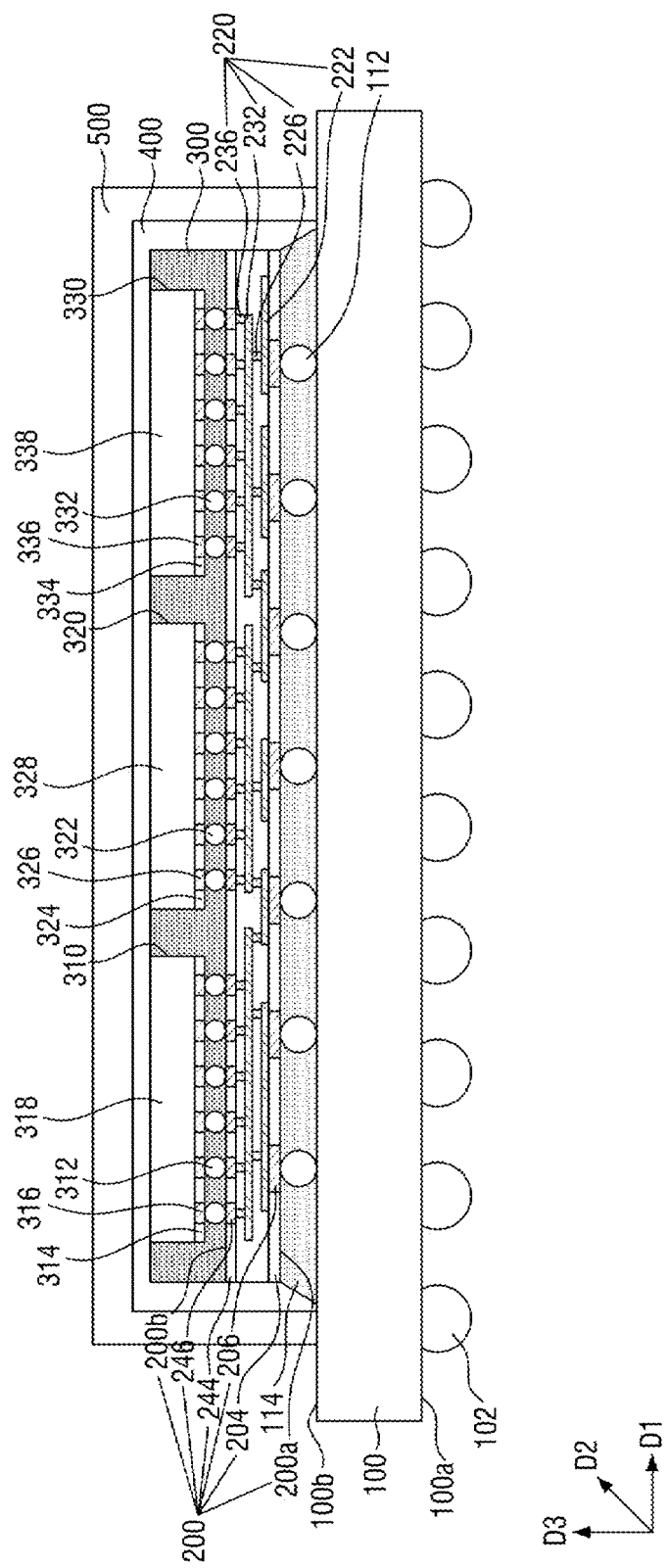
FIG. 11 is a view illustrating a semiconductor package according to some other embodiments of the present disclosure.

FIG. 11 is a view illustrating a semiconductor package according to some other embodiments of the present disclosure. The following description will focus on differences from the embodiment of FIG. 10.

Referring to FIG. 11, a semiconductor package according to some other embodiments of the present disclosure may further include the heat slug 500. The heat slug 500 may be disposed on the block copolymer film 400. The heat slug 500 may extend along the block copolymer film 400.

Figure 12:
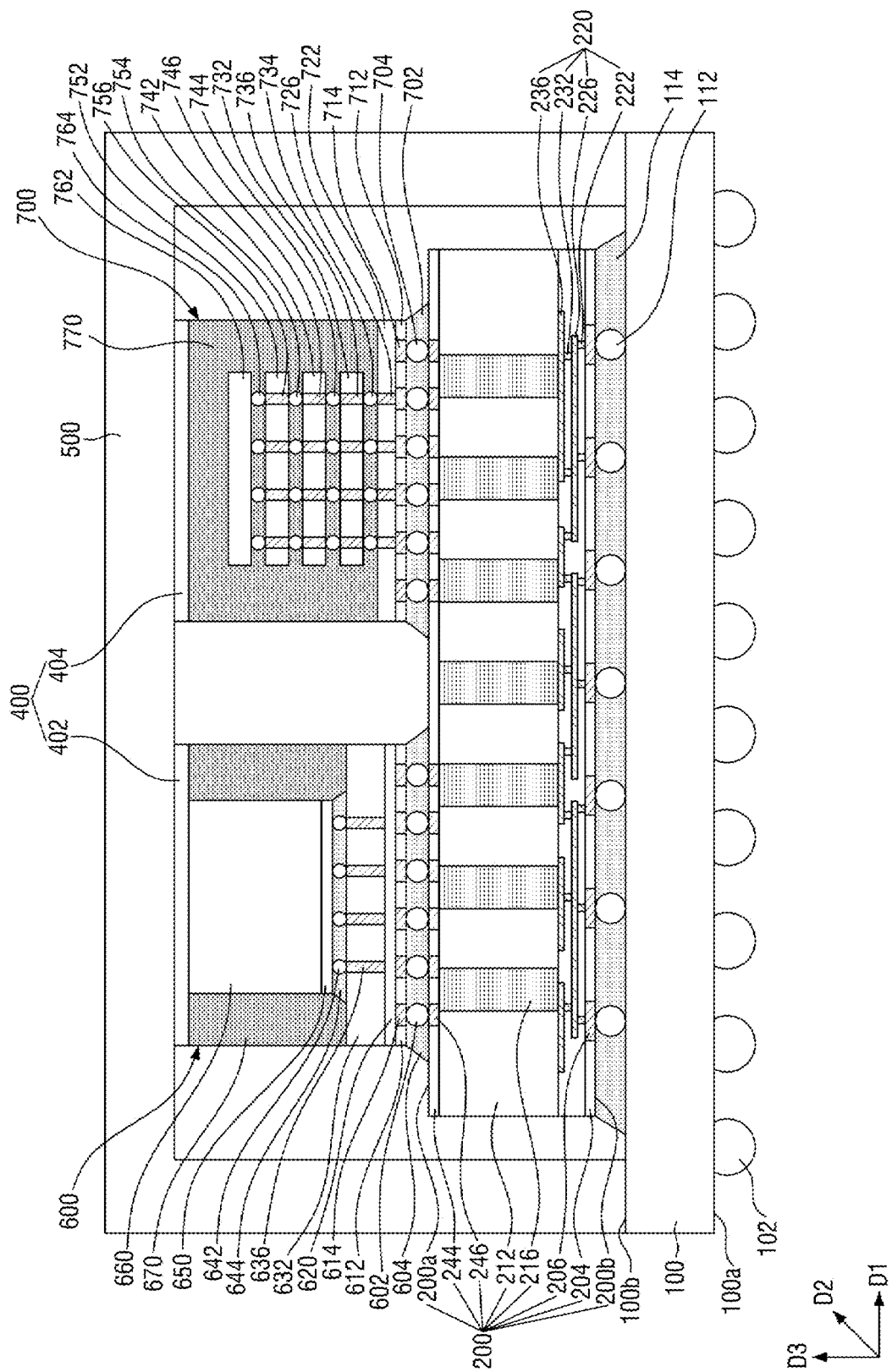
FIG. 12 is a view illustrating a semiconductor package according to some other embodiments of the present disclosure.

FIG. 12 is a view illustrating a semiconductor package according to some other embodiments of the present disclosure. The following description will focus on differences from the embodiment of FIG. 1.

Referring to FIG. 12, a semiconductor package according to some other embodiments of present disclosure may include the substrate 100, the underfill material 114, the internal connection terminals 112, the interposer layer 200, the block copolymer film 400, a first chip package 600, and a second chip package 700.

The first chip package 600 may include a third passivation layer 612, a first redistribution layer 620, a first semiconductor chip 632, a second redistribution layer 650, a second semiconductor chip 660, and a first molding layer 670.

First connection terminals 602 may be disposed between the first chip package 600 and the interposer layer 200. The first connection terminals 602 may contact the redistribution pads 246 and first chip pads 614. A first underfill material 604 may be formed to enclose the first connection terminals 602. The first chip pads 614 may be electrically connected to the first redistribution layer 620. The first redistribution layer 620 may be disposed on the third passivation layer 612. The first semiconductor chip 632 may be disposed on the first redistribution layer 620. Second through vias 636 may be disposed in the first semiconductor chip 632 to penetrate the first semiconductor chip 632.

The second semiconductor chip 660 may be disposed over the first semiconductor chip 632. The first semiconductor chip 632 and the second semiconductor chip 660 may be stacked in the third direction D3. The first semiconductor chip 632 and the second semiconductor chip 660 may be connected to each other through second connection terminals 642. A second underfill material 644 may be formed to enclose the second connection terminals 642. The second redistribution layer 650 may be disposed under a surface of the second semiconductor chip 660 opposing the first semiconductor chip 632. The second semiconductor chip 660 may be disposed on the second redistribution layer 650. The first molding layer 670 may extend along a side surface of the second semiconductor chip 660. A first block copolymer film 402 may be disposed on top surfaces of the first molding layer 670 and the second semiconductor chip 660.

The first semiconductor chip 632 and the second semiconductor chip 660 may be different types of semiconductor chips. For example, the first semiconductor chip 632 may be a logic chip and the second semiconductor chip 660 may be a memory chip such as an SRAM, or vice versa.

The second chip package 700 may include a fourth passivation layer 712, a buffer semiconductor chip 722, third to sixth semiconductor chips 732, 742, 752 and 762, and fourth to seventh connection terminals 734, 744, 754 and 764, third to sixth through vias 726, 736, 746 and 756, a second molding layer 770, and a second block copolymer film 404.

The fourth passivation layer 712 may be disposed at a bottom portion of the second chip package 700. The fourth passivation layer 712 may include second chip pads 714. Third connection terminals 704 may be disposed between the second chip package 700 and the interposer layer 200. The third connection terminals 704 may contact the redistribution pads 246 and the second chip pads 714. A third underfill material 702 may be formed to enclose the third connection terminals 704.

The buffer semiconductor chip 722 may be disposed on the fourth passivation layer 712. The third to sixth semiconductor chips 732, 742, 752, and 762 may be sequentially stacked over the buffer semiconductor chip 722. Although four memory semiconductor chips are illustrated in the drawing to be stacked over the buffer semiconductor chip 722, the present inventive concept is not limited thereto. That is, the number of semiconductor chips stacked on the buffer semiconductor chip 722 is not limited thereto. The third to sixth semiconductor chips 732, 742, 752, and 762 may be, for example, memory chips.

The third through vias 726 may be disposed to penetrate the buffer semiconductor chip 722 in the third direction D3. The third through vias 726 may be connected to the third connection terminals 704 and the fourth connection terminals 734.

The fourth through vias 736 may be disposed to penetrate the third semiconductor chip 732 in the third direction D3. The fourth through vias 736 may be connected to the fourth connection terminals 734 and the fifth connection terminals 744.

The fifth through vias 746 may be disposed to penetrate the fourth semiconductor chip 742 in the third direction D3. The fifth through vias 746 may be connected to the fifth connection terminals 744 and the sixth connection terminals 754.

The sixth through vias 756 may be disposed to penetrate the fifth semiconductor chip 752 in the third direction D3. The sixth through vias 756 may be connected to the sixth connection terminals 754 and the seventh connection terminals 764.

The third to sixth through vias 726, 736, 746, and 756 may be conductive through vias. Accordingly, the third to sixth semiconductor chips 732, 742, 752, and 762 may be electrically connected to the buffer semiconductor chip 722 through the third to sixth through vias 726, 736, 746 and 756.

The second molding layer 770 may cover the buffer semiconductor chip 722 and the third to sixth semiconductor chips 732, 742, 752 and 762. The second molding layer 770 may fill gaps between the buffer semiconductor chip 722 and the third to sixth semiconductor chips 732, 742, 752 and 762, and gaps between the third to sixth semiconductor chips 732, 742, 752 and 762.

The second block copolymer film 404 may be disposed on a top surface of the second molding layer 770.

The heat slug 500 may be disposed on the first block copolymer film 402 and the second block copolymer film 404. The first and second block copolymer films 402 and 404 may function as adhesive layers for attaching the heat slug 500 to the first and second chip packages 600 and 700.

Figure 13:
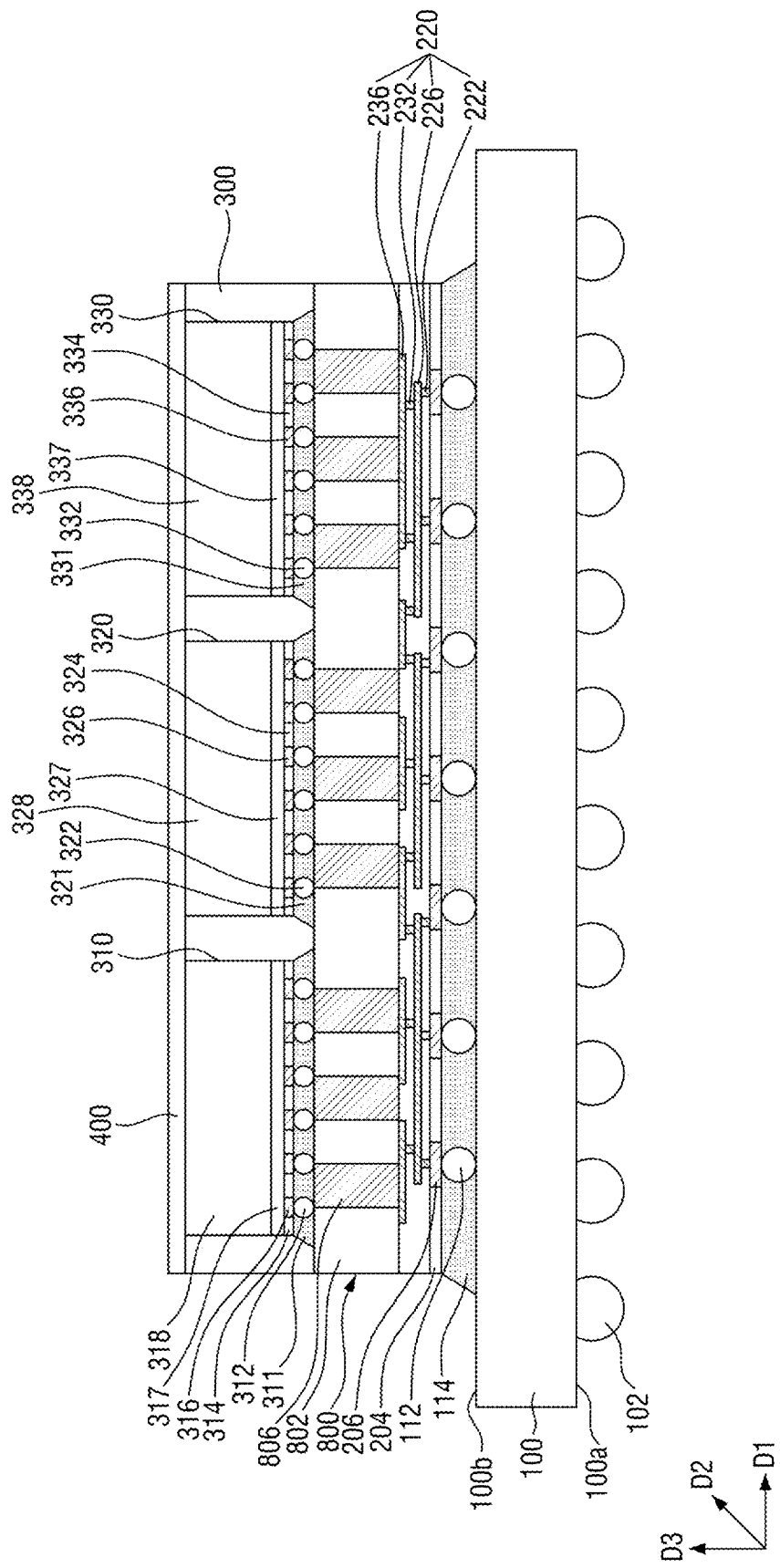
FIG. 13 is a view illustrating a semiconductor package according to some other embodiments of the present disclosure.

FIG. 13 is a view illustrating a semiconductor package according to some other embodiments of the present disclosure. The following description will focus on differences from the embodiment of FIG. 8.

Referring to FIG. 13, a semiconductor package according to some embodiments of the present disclosure may further include a first chip package 800 disposed on the redistribution layer 220. The first chip package 800 may include a fourth semiconductor chip 802 and second through vias 806.

The second through vias 806 may be disposed to penetrate the fourth semiconductor chip 802. The second through vias 806 may be connected to the redistribution layer 220 and the first to third connection terminals 312, 322, and 332. The second through vias 806 may be disposed to penetrate the fourth semiconductor chip 802 in the third direction D3. The second through vias 806 may be conductive through vias. Accordingly, the fourth semiconductor chip 802 may be electrically connected to the first to third semiconductor chips 318, 328, and 338 through the second through vias 806.

For example, the first to third semiconductor chips 318, 328, and 338 may be logic chips and the fourth semiconductor chip 802 may be a memory chip, or vice versa.

The block copolymer film 400 may be disposed on the first to third semiconductor chips 318, 328, and 338, and the molding layer 300.

In the drawing, the first chip package 800 is disposed between the redistribution layer 220 and the first to third semiconductor chips 318, 328, and 338, but the present disclosure is not limited thereto. The first chip package 800 may be disposed between the redistribution layer 220 and the internal connection terminals 112. That is, the redistribution layer 220 may be disposed on a top surface of the first chip package 800. The first chip package 800 may be connected to the internal connection terminals 112 and the redistribution layer 220 through the second through vias 806.

Figure 14:
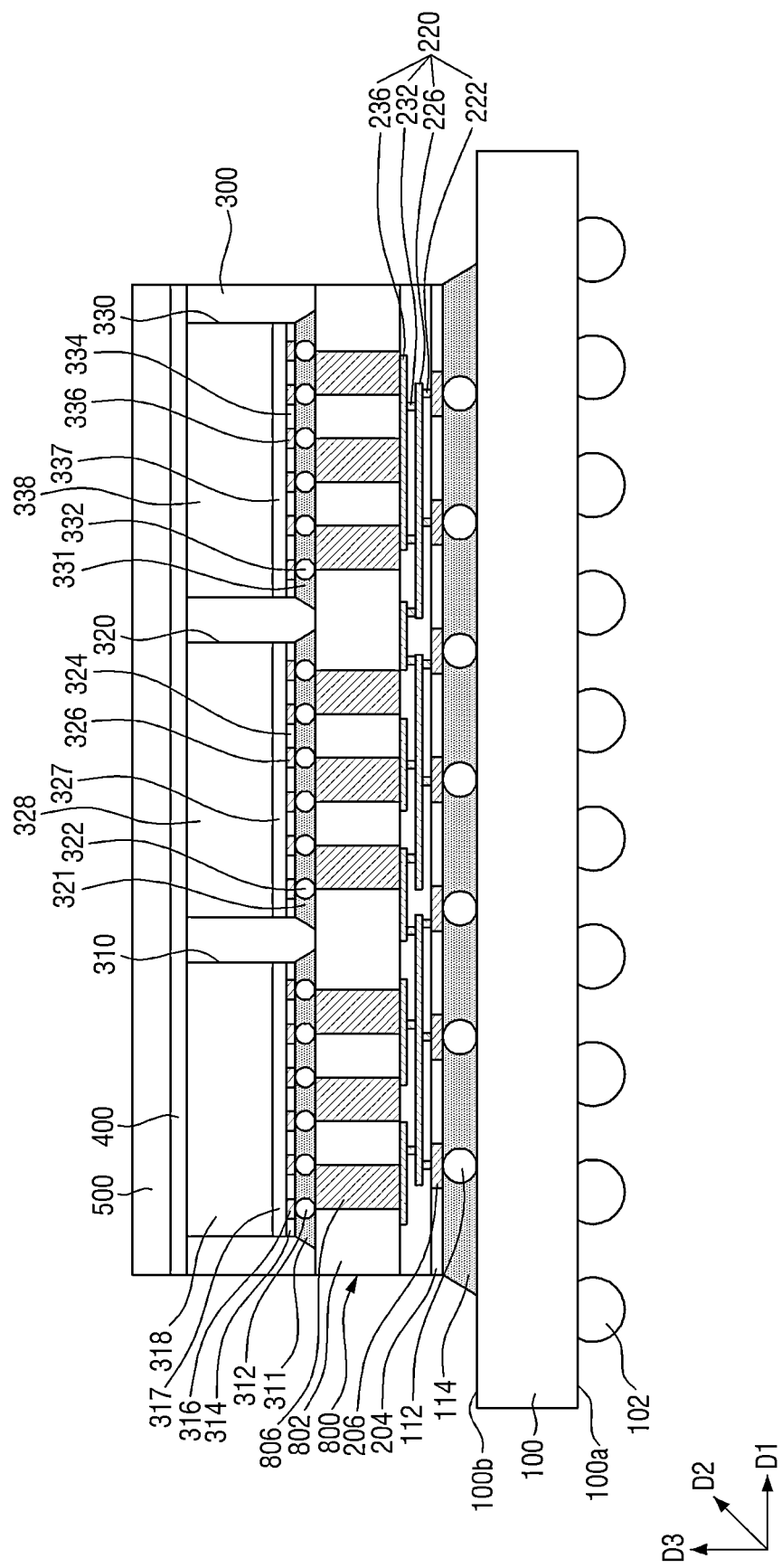
FIG. 14 is a view illustrating a semiconductor package according to some other embodiments of the present disclosure.

FIG. 14 is a view illustrating a semiconductor package according to some other embodiments of the present disclosure. The following description will focus on differences from the embodiment of FIG. 13.

Referring to FIG. 14, a semiconductor package according to some embodiments of present disclosure may further include the heat slug 500. The heat slug 500 may be disposed on the block copolymer film 400.

Figure 15:
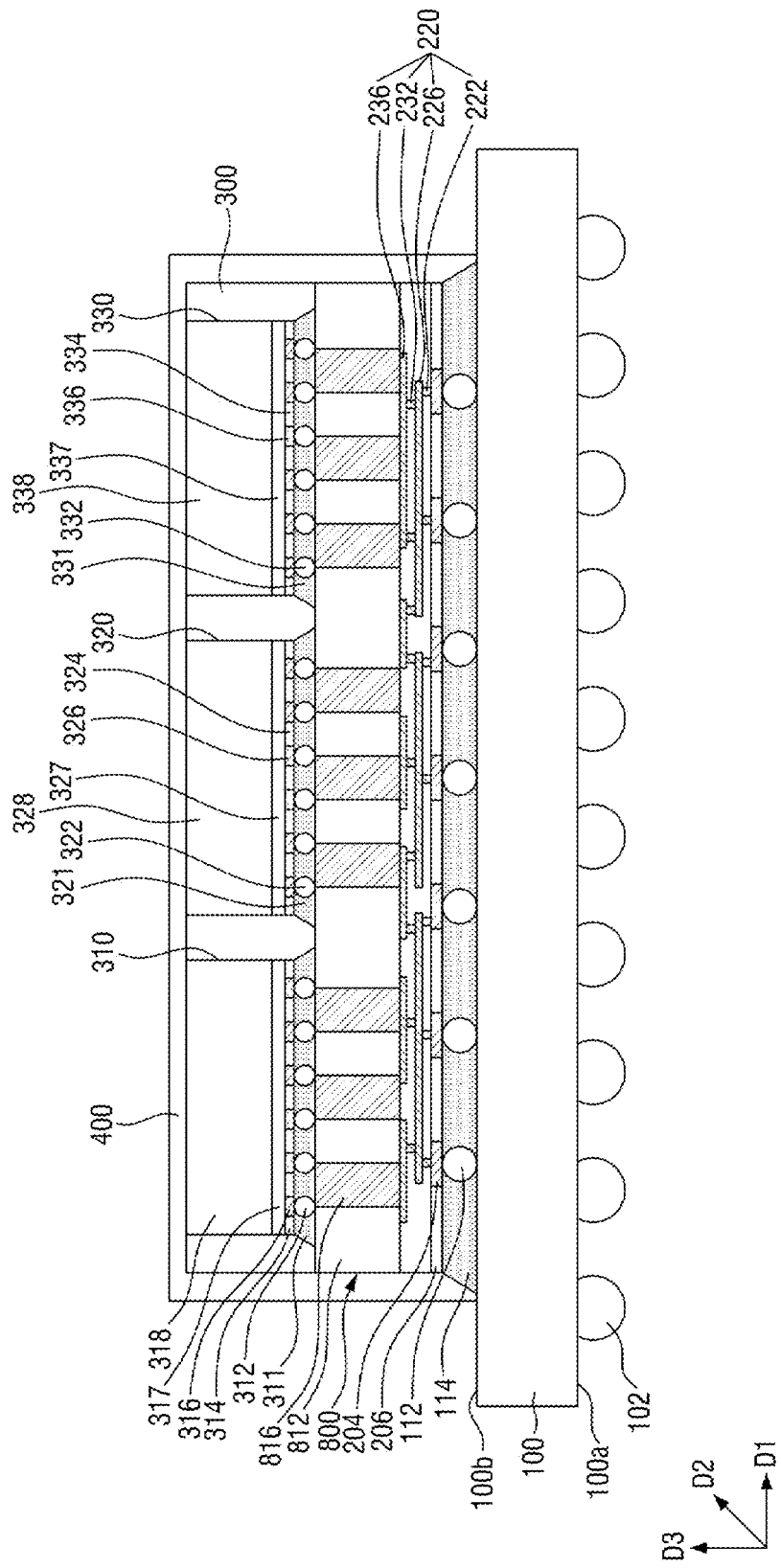
FIG. 15 is a view illustrating a semiconductor package according to some other embodiments of the present disclosure.

FIG. 15 is a view illustrating a semiconductor package according to some other embodiments of the present disclosure. The following description will focus on differences from the embodiment of FIG. 13.

Referring to FIG. 15, the block copolymer film 400 may be disposed on the first to third semiconductor chips 318, 328, and 338, the molding layer 300 and the first chip package 800. That is, the block copolymer film 400 may extend along the top surfaces of the first to third semiconductor chips 318 328, and 338, the top surface and the side surface of the molding layer 300, and the side surface of the first chip package 800.

Although not shown in the drawing, the block copolymer film 400 may be connected to the ground region of the substrate 100. The substrate 100 may include the ground region and the ground via connected to the ground region. The block copolymer film 400 may be connected to the ground region through the ground via. For example, graphite of the block copolymer film 400 may be connected to the ground region through the ground via.

Figure 16:
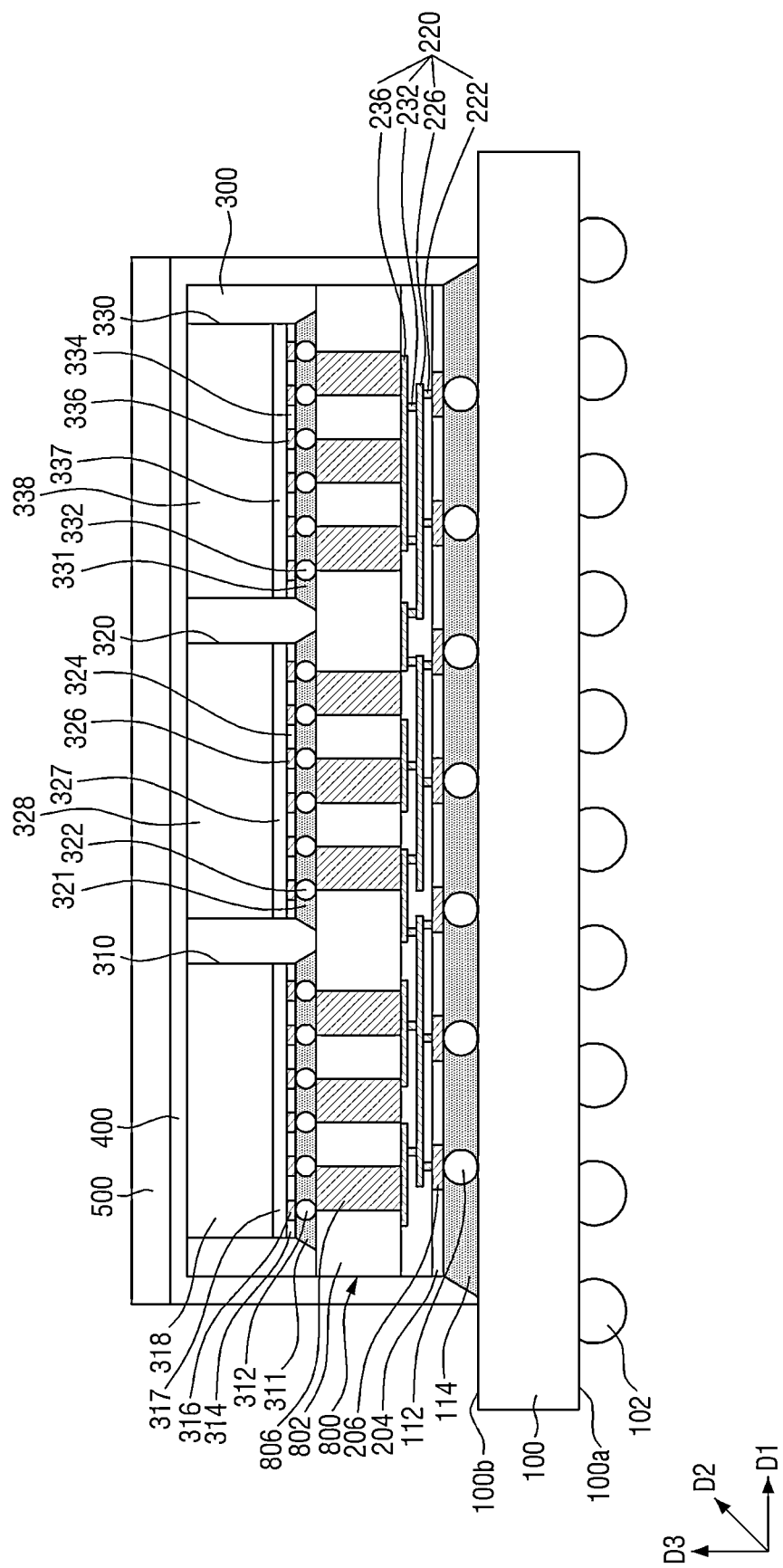
FIG. 16 is a view illustrating a semiconductor package according to some other embodiments of the present disclosure.

FIG. 16 is a view illustrating a semiconductor package according to some other embodiments of the present disclosure. The following description will focus on differences from the embodiment of FIG. 15.

Referring to FIG. 16, a semiconductor package according to some other embodiments of the present disclosure may further include the heat slug 500. The heat slug 500 may be disposed on the block copolymer film 400. The heat slug 500 may extend along the block copolymer film 400.

Figure 17:
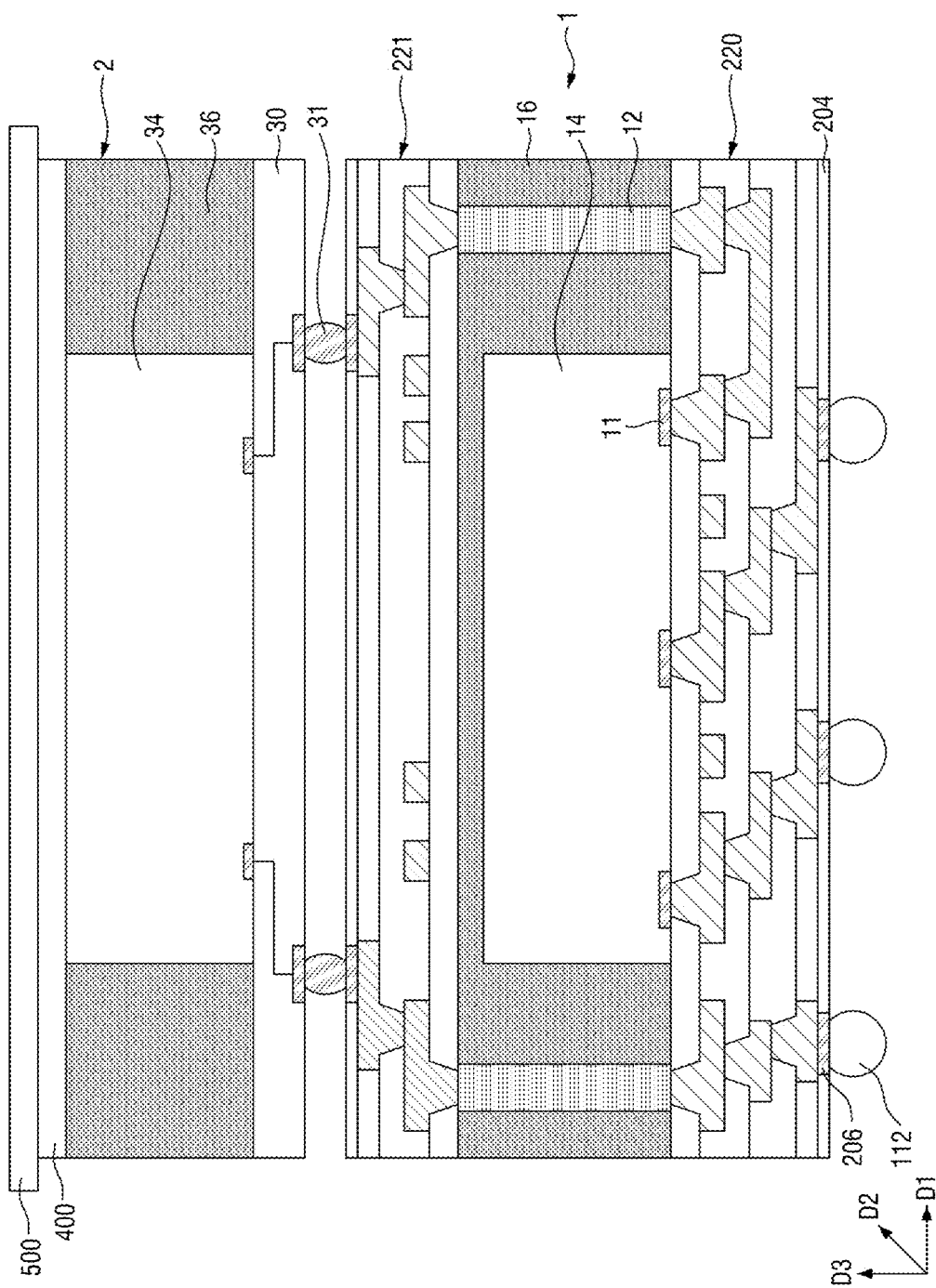
FIG. 17 is a view illustrating a semiconductor package according to some other embodiments of the present disclosure.

FIG. 17 is a view illustrating a semiconductor package according to some other embodiments of the present disclosure.

Referring to FIG. 17, a semiconductor package according to some other embodiments of the present disclosure may include a first chip package 1, a second chip package 2, chip connection terminals 31, and the internal connection terminals 112.

The internal connection terminals 112 may be disposed on a bottom surface of the first chip package 1.

The first chip package 1 may include the first passivation layer 204, a lower redistribution layer 220, and an upper redistribution layer 221. The internal connection terminals 112 may be disposed on a bottom surface of the first passivation layer 204. The first passivation layer 204 may include the connection pads 206. The connection pads 206 may be connected to the internal connection terminals 112.

The lower redistribution layer 220 may be disposed on a top surface of the first passivation layer 204. The lower redistribution layer 220 may include redistribution patterns, vias, and insulating layers.

A first semiconductor chip 14 may be disposed on the lower redistribution layer 220. First chip pads 11 may be disposed between the first semiconductor chip 14 and the lower redistribution layer 220. The first chip pads 11 may be disposed on the lower redistribution layer 220. The first chip pads 11 may be in contact with and electrically connected to the lower redistribution layer 220. Therefore, the first semiconductor chip 14 may be electrically connected to the lower redistribution layer 220.

First through vias 12 may be disposed on the lower redistribution layer 220. The first through vias 12 may be disposed at both sides of the first semiconductor chip 14. The first through vias 12 may be disposed to penetrate a first molding layer 16 in the third direction D3. The first through vias 12 may be in contact with and electrically connected to the redistribution layer 220.

The first molding layer 16 may be disposed on the lower redistribution layer 220. The first molding layer 16 may be formed to enclose the first semiconductor chip 14 and the first through vias 12. The first molding layer 16 may be disposed between the first semiconductor chip 14 and the first through vias 12. The first molding layer 16 may cover an outer side surface of the first semiconductor chip 14.

The upper redistribution layer 221 may be disposed on the first molding layer 16. The upper redistribution layer 221 may include redistribution patterns, vias, and insulating layers. The upper redistribution layer 221 may be in contact with and electrically connected to the first through vias 12.

The second chip package 2 may be disposed over the upper redistribution layer 221. The second chip package 2 may be arranged to be stacked with the first chip package 1 in the third direction D3. Chip connection terminals 31 may be disposed between the second chip package 2 and the upper redistribution layer 221. The chip connection terminals 31 may be electrically connected to the upper redistribution layer 221.

The second chip package 2 may include a substrate 30, a second semiconductor chip 34 and a second molding layer 36.

The substrate 30 may be, for example, a PCB substrate. The second semiconductor chip 34 may be disposed on the substrate 30. The second semiconductor chip 34 may be disposed on a top surface of the substrate 30. A second molding layer 36 may be disposed on the substrate 30 and the second semiconductor chip 34. That is, the second molding layer 36 may be disposed along a side surface of the second semiconductor chip 34 and the top surface of the substrate 30. The second molding layer 36 may expose a top surface of the second semiconductor chip 34.

The block copolymer film 400 may be disposed on the top surface of the second semiconductor chip 34 and a top surface of the second molding layer 36. The block copolymer film 400 may contact the top surface of the second semiconductor chip 34. Therefore, heat generated in the semiconductor package can be easily released to the outside through the block copolymer film 400.

In addition, the semiconductor package according to some embodiments of the present disclosure may further include the heat slug 500. The heat slug 500 may be disposed on the block copolymer film 400. Therefore, the heat generated in the semiconductor package can be easily released to the outside through the block copolymer film 400 and the heat slug 500.

Figure 18:
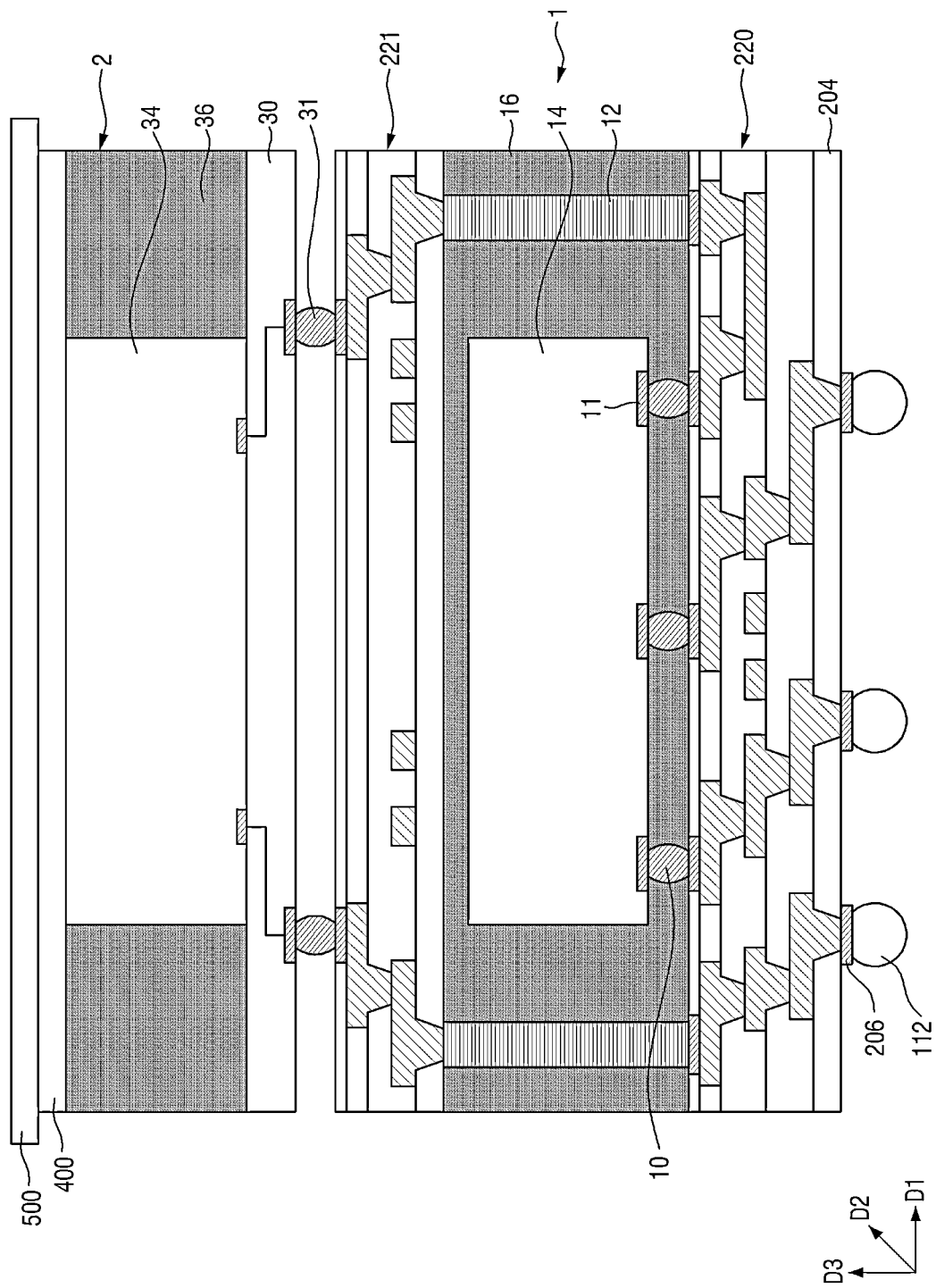
FIG. 18 is a view illustrating a semiconductor package according to some other embodiments of the present disclosure.

FIG. 18 is a view illustrating a semiconductor package according to some other embodiments of the present disclosure. The following description will focus on differences from the embodiment of FIG. 17.

Referring to FIG. 18, first connection terminals 10 may be disposed between the first semiconductor chip 14 and the lower redistribution layer 220. That is, the first connection terminals 10 may be disposed on a bottom surface of the first semiconductor chip 14 and a top surface of the lower redistribution layer 220. The first semiconductor chip 14 may be connected to the lower redistribution layer 220 through the first connection terminals 10.

Although the first through via 12 is illustrated as a single through via in the drawing, the present inventive concept is not limited thereto. For example, the first through via 12 may be formed of a plurality of via layers.

In addition, although a fan-out wafer level package (FOWLP) is illustrated as the semiconductor package in the drawing, the present inventive concept is not limited thereto. For example, the semiconductor package according to some embodiments may be a different type of a semiconductor package, the bottom surface of which has a redistribution structure, such as a fan-in wafer level package (FIWLP), a fan-out panel level package (FOPLP), or the like.

Figure 19:
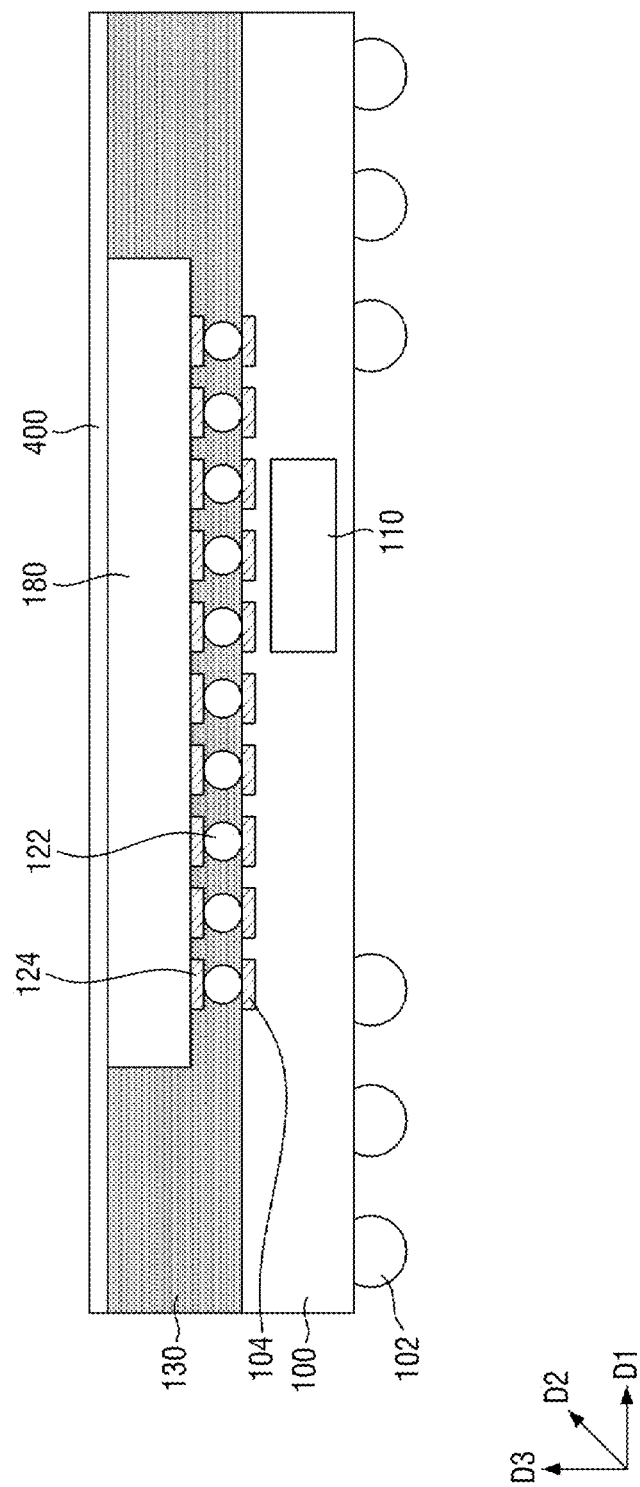
FIG. 19 is a view illustrating a semiconductor package according to some other embodiments of the present disclosure.

FIG. 19 is a view illustrating a semiconductor package according to some other embodiments of the present disclosure. The following description will focus on differences from the embodiment of FIG. 1.

Referring to FIG. 19, a semiconductor package according to some other embodiments of the present disclosure may include a first substrate 100, the external connection terminals 102, solder layers 122, a molding layer 130, a first semiconductor chip 180, and the block copolymer film 400.

The first substrate 100 may include a circuit element 110. The circuit element 110 may include various active elements, such as transistors and the like, or various passive elements, such as capacitors, resistors, inductors and the like. FIG. 19 illustrates that the circuit element 110 is disposed in the first substrate 100, but the present inventive concept is not limited thereto. For example, the circuit element 110 may be disposed on a top or bottom surface of the first substrate 100.

First connection pads 104 may be disposed on the first substrate 100. The first connection pads 104 may be connected to wiring patterns or the like formed in the first substrate 100. The first connection pads 104 may be portions through which the wiring patterns of the first substrate 100 are connected to the outside.

The first semiconductor chip 180 may be mounted over a top surface of the first substrate 100. The first semiconductor chip 180 may be, for example, an application processor (AP).

Conductive pillars 124 may protrude from a bottom surface of the first semiconductor chip 180. The conductive pillars 124 may be connected to the first semiconductor chip 180. The solder layers 122 are interposed between the first substrate 100 and the first semiconductor chip 180 to electrically connect the first substrate 100 to the first semiconductor chip 180. The conductive pillars 124 and the solder layers 122 may include, for example, tin (Sn), indium (In), bismuth (Bi), antimony (Sb), copper (Cu), silver (Ag), zinc (Zn), lead (Pb), or a combination thereof, but the present disclosure is not limited thereto.

The molding layer 130 may be disposed on the first substrate 100. The molding layer 130 may be formed to enclose the solder layers 122, the first semiconductor chip 180, and the conductive pillars 124. The molding layer 130 may fill a gap between the first semiconductor chip 180 and the first substrate 100. Further, the molding layer 130 may fill a gap between the adjacent solder layers 122 and between the adjacent conductive pillars 124. The drawing illustrates that the molding layer 130 covers a side surface of the first semiconductor chip 180 and exposes a top surface thereof, but this is merely an example. As another example, the molding layer 130 may cover both the side and top surfaces of the first semiconductor chip 180.

The block copolymer film 400 may be disposed on the first semiconductor chip 180 and the molding layer 130. The block copolymer film 400 may extend along the top surface of the first semiconductor chip 180 and a top surface of the molding layer 130. The block copolymer film 400 may contact the top surfaces of the first semiconductor chip 180 and the molding layer 130. The block copolymer film 400 may cover the entire top surfaces of the first semiconductor chip 180 and the molding layer 130.

Figure 20:
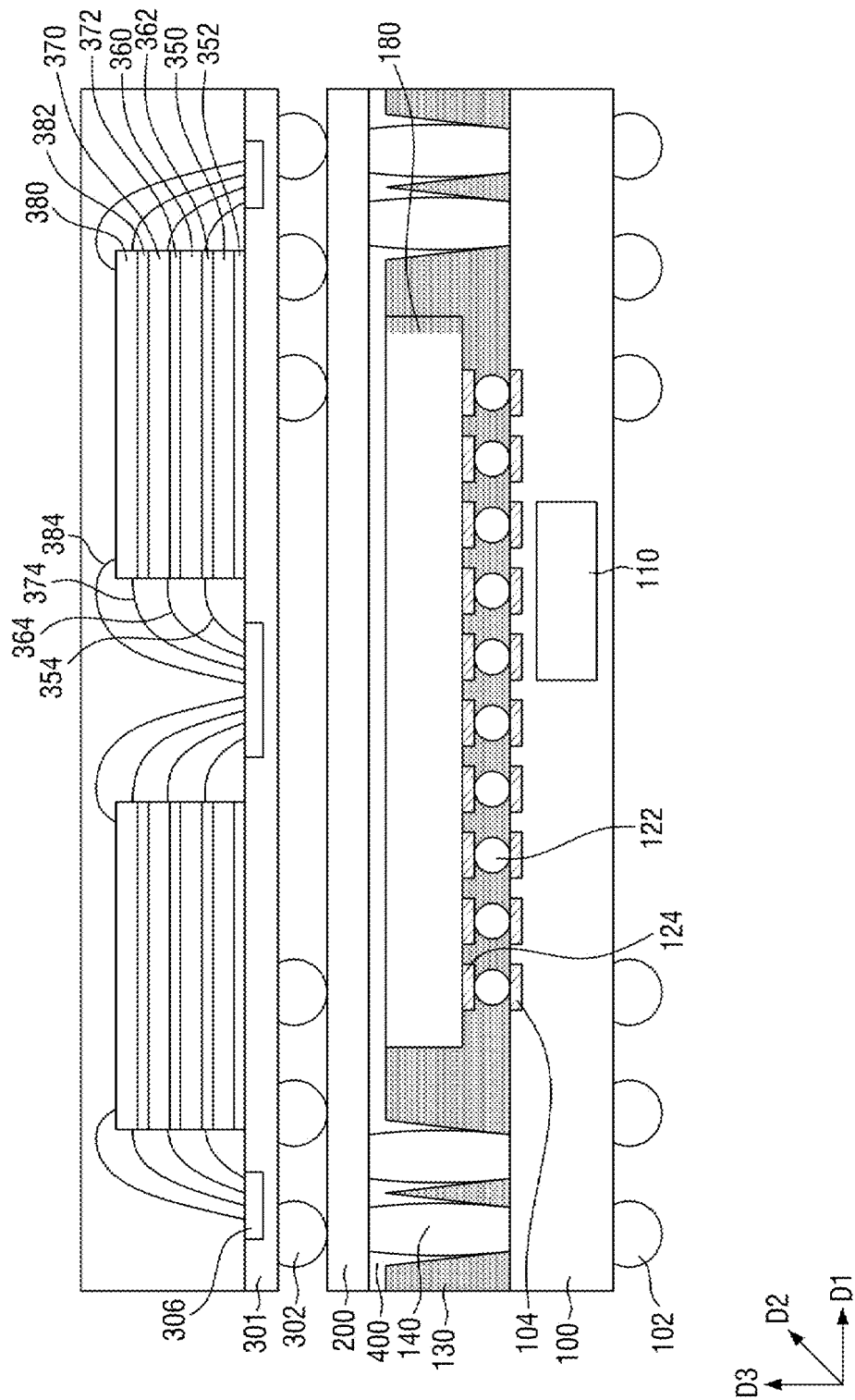
FIG. 20 is a view illustrating a semiconductor package according to some other embodiments of the present disclosure.

FIG. 20 is a view illustrating a semiconductor package according to some other embodiments of the present disclosure. The following description will focus on differences from the embodiment of FIG. 19.

Referring to FIG. 20, first connecting members 140 may be disposed between the first substrate 100 and the interposer layer 200 to electrically connect the first substrate 100 to the interposer layer 200. The first connecting members 140 may electrically connect the wiring patterns in the first substrate 100 to the connection pads in the interposer layer 200. The first connecting members 140 may be formed in plural to surround the first semiconductor chip 180.

The molding layer 130 may fill a gap between the adjacent first connecting members 140. The molding layer 130 may be formed to at least partially enclose the first connecting member 140 and expose the remaining portion.

The block copolymer film 400 may fill gaps between the interposer layer 200 and the molding layer 130, between the interposer layer 200 and the first semiconductor chip 180, and between the first connecting member 140 and the molding layer 130. Further, the block copolymer film 400 may fill a gap between the adjacent first connecting members 140. That is, the block copolymer film 400 not only can release heat generated from the first semiconductor chip 180 to the outside, but also may function as a gap fill layer to fill the gap between the interposer layer 200 and the molding layer 130.

Second connecting members 302 may be disposed on the interposer layer 200. The second connecting members 302 are disposed between the interposer layer 200 and a second substrate 301 to electrically connect the interposer layer 200 to the second substrate 301. The second connecting member 302 may be connected to the redistribution layer of the interposer layer 200 and wiring patterns of the second substrate 301.

Second connection pads 306 may be disposed on a top surface of the second substrate 301. The second connection pads 306 may be connected to the wiring patterns or the like formed in the second substrate 301. The second connection pads 306 may be portions through which the wiring patterns of the second substrate 301 are connected to the outside.

The second substrate 301 may be a package substrate. The second substrate 301 may be, for example, a PCB substrate or a ceramic substrate. A plurality of semiconductor chips may be mounted on the second substrate 301. The semiconductor chips may be sequentially stacked on the second substrate 301, and/or may be formed side by side on the second substrate 301.

For example, a second semiconductor chip 350 may be mounted on the second substrate 301. The second semiconductor chip 350 may be mounted on the second substrate 301 via a first attaching member 352. The first attaching member 352 may include an adhesive means which attaches a bottom surface of the second semiconductor chip 350 to the top surface of the second substrate 301. The second semiconductor chip 350 may be connected to the second substrate 301 via a first bonding wire 354. The first bonding wire 354 may be electrically connected to the second connection pad 306.

A third semiconductor chip 360 may be stacked on the second semiconductor chip 350. The third semiconductor chip 360 may be disposed on the second semiconductor chip 350 via a second attaching member 362. The second attaching member 362 may include an adhesive means which attaches a bottom surface of the third semiconductor chip 360 to the top surface of the second semiconductor chip 350. Similarly to the first semiconductor chip 120, the third semiconductor chip 360 may be connected to the second substrate 301 via a second bonding wire 364.

A fourth semiconductor chip 370 may be disposed on the third semiconductor chip 360 via a third attaching member 372. The fourth semiconductor chip 370 may be connected to the second substrate 301 via a third bonding wire 374. A fifth semiconductor chip 380 may be disposed on the fourth semiconductor chip 370 via a fourth attaching member 382. The fifth semiconductor chip 380 may be connected to the second substrate 301 via a fourth bonding wire 384.

That is, the semiconductor package according to some embodiments of the present disclosure may be a package-on-package (POP) semiconductor package in which two or more packages are stacked.

While some embodiments of inventive concepts have been described, the embodiments described herein should be considered in a descriptive sense only and not for purposes of limitation. Those skilled in the art will appreciate that many variations and modifications in form and detail may be made without substantially departing from the sprit and scope of inventive concepts as defined in the following claims.

What is claimed is:

1. A semiconductor package comprising:
an interposer layer including a first surface and a second surface opposing each other;
a first semiconductor chip and a second semiconductor chip on the first surface of the interposer layer, the first semiconductor chip and the second semiconductor chip being different types of semiconductor chips from each other and spaced apart from each other in a first direction; and
a block copolymer film on the first semiconductor chip and the second semiconductor chip, the block copolymer film including a first pattern and a second pattern that are different from each other, one of the first pattern and the second pattern containing graphite, wherein
the first semiconductor chip includes a memory chip,
the second semiconductor chip includes one of a logic chip and a plurality of semiconductor memory chips, the plurality of semiconductor memory chips being stacked on each other in a third direction perpendicular to the first direction, and the first pattern and the second pattern extend in a second direction on the first semiconductor chip and the second semiconductor chip, the second direction intersects the first direction, and the first pattern and the second pattern are spaced apart from each other in the first direction.

2. The semiconductor package of claim 1, wherein
the first semiconductor chip is the memory chip,
the second semiconductor chip is the logic chip,
the first pattern is on the first semiconductor chip,
the second pattern is on the second semiconductor chip, and
the second pattern contains the graphite.

3. The semiconductor package of claim 2, wherein
the first semiconductor chip includes a plurality of memory chips stacked in the third direction,
the plurality of memory chips are electrically connected to each other through a first through via extending in the third direction, and
the plurality of memory chips include the memory chip.

4. The semiconductor package of claim 1, wherein
the first semiconductor chip includes a logic semiconductor chip and the memory chip stacked on the logic semiconductor chip in the third direction, and
the second semiconductor chip includes the plurality of semiconductor memory chips stacked in the third direction.

5. The semiconductor package of claim 4, wherein the plurality of semiconductor memory chips are electrically connected to each other through a through via extending in the third direction.

6. The semiconductor package of claim 1, further comprising:
a molding layer on the first surface of the interposer layer, wherein
the molding layer includes a first trench and a second trench exposing the first surface,
the first semiconductor chip is in the first trench and electrically connected to the interposer layer, and
the second semiconductor chip is in the second trench and electrically connected to the interposer layer.

7. The semiconductor package of claim 6, wherein the block copolymer film extends along a sidewall of the molding layer, a top surface of the molding layer, and a sidewall of the interposer layer.

8. The semiconductor package of claim 7, further comprising:
a connection terminal on the second surface of the interposer layer; and
a substrate electrically connected to the interposer layer by the connection terminal, the substrate including a ground electrode therein,
wherein the block copolymer film extends to the substrate and is connected to the ground electrode.

9. The semiconductor package of claim 1, further comprising:
a heat slug on the block copolymer film.

10. The semiconductor package of claim 1, wherein
the interposer layer includes a first passivation layer, a substrate layer on the first passivation layer, a redistribution layer on the substrate layer, and a second passivation layer on the redistribution layer, the first passivation layer includes a connection pad electrically connected to one or more connection terminals, the substrate layer includes a first through via, the redistribution layer includes a plurality of redistribution patterns and a plurality of vias, the second passivation layer includes a redistribution pad, the first through via penetrates the substrate layer in a third direction perpendicular to the first direction, and the first through via electrically connects the connection pad to the redistribution pad.

11. The semiconductor package of claim 1, wherein
the interposer layer includes a passivation layer and a redistribution layer on the passivation layer,
the passivation layer includes a connection pad electrically connected to one or more connection terminals, and
the redistribution layer includes a plurality of metal layers electrically connected to the connection pad.

12. A semiconductor package comprising:
a substrate including a first surface and a second surface opposing each other;
a first semiconductor chip mounted on the first surface of the substrate;
a second semiconductor chip on the first semiconductor chip and electrically connected to the first semiconductor chip through a through via penetrating the first semiconductor chip;
a molding layer surrounding a top surface of the first semiconductor chip and a side surface of the second semiconductor chip; and
a block copolymer film on a top surface of the molding layer and a top surface of the second semiconductor chip, the block copolymer film including a first pattern and a second pattern that are different from each other, one of the first pattern and the second pattern containing graphite.

13. The semiconductor package of claim 12, further comprising:
a first redistribution layer on a surface of the first semiconductor chip opposing the substrate; and
a second redistribution layer on a surface of the second semiconductor chip opposing the first semiconductor chip,
wherein the through via extends between the first redistribution layer and the second redistribution layer.

14. The semiconductor package of claim 12, further comprising:
a first redistribution layer on a surface of the first semiconductor chip opposing the second semiconductor chip; and
a second redistribution layer on a surface of the second semiconductor chip opposing the first semiconductor chip,
wherein the through via extends between the first redistribution layer and the second redistribution layer.

15. The semiconductor package of claim 12, wherein
the first semiconductor chip is a memory chip,
the second semiconductor chip is a plurality of logic chips, and
the plurality of logic chips are horizontally spaced apart from each other.

16. The semiconductor package of claim 12, wherein the block copolymer film extends to the first surface of the substrate along a side surface of the first semiconductor chip and the side surface of the second semiconductor chip.

17. A semiconductor package comprising:
a package substrate including a ground electrode therein;
an interposer layer connected to the package substrate through one or more first connection terminals,
 the interposer layer including a passivation layer and a redistribution layer on the passivation layer,
 the passivation layer including a connection pad electrically connected to the first connection terminals,
 the redistribution layer including a plurality of redistribution patterns electrically connected to the connection pad;
a semiconductor chip connected to the interposer layer through one or more second connection terminals, the second connection terminals being electrically to the redistribution layer; and
a block copolymer film including a first pattern containing graphite and a second pattern not containing graphite,
the block copolymer film extending along an outer side surface of the semiconductor chip and a side surface of the interposer layer, and
the block copolymer film being connected to the ground electrode.

18. The semiconductor package of claim 17, wherein
the semiconductor chip includes a logic chip and a memory chip that are spaced apart from each other in a first direction and mounted on the interposer layer,
the first pattern is on a top surface of the logic chip, and
the second pattern is on a top surface of the memory chip.

* * * * *